(12) United States Patent
Leigh et al.

(10) Patent No.: US 11,079,560 B2
(45) Date of Patent: Aug. 3, 2021

(54) TRANSCEIVER MODULE

(71) Applicant: HEWLETT PACKARD ENTERPRISE DEVELOPMENT LP, Houston, TX (US)

(72) Inventors: Kevin B Leigh, Houston, TX (US); John Norton, Houston, TX (US); George D Megason, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 290 days.

(21) Appl. No.: 16/311,530

(22) PCT Filed: Nov. 26, 2014

(86) PCT No.: PCT/US2014/067669
§ 371 (c)(1),
(2) Date: Dec. 19, 2018

(87) PCT Pub. No.: WO2016/085501
PCT Pub. Date: Jun. 2, 2016

(65) Prior Publication Data
US 2019/0146167 A1    May 16, 2019

(51) Int. Cl.
*G02B 6/42* (2006.01)
*H05K 1/18* (2006.01)
(Continued)

(52) U.S. Cl.
CPC ........... *G02B 6/4261* (2013.01); *G02B 6/428* (2013.01); *G02B 6/4246* (2013.01);
(Continued)

(58) Field of Classification Search
CPC .. G02B 6/4261; G02B 6/4284; G02B 6/4277; G02B 6/4278; G02B 6/428;
(Continued)

(56) References Cited

U.S. PATENT DOCUMENTS 5,417,586 A * 5/1995 Endo ..................... H01R 13/641
439/353
6,045,415 A * 4/2000 May ...................... H01R 13/111
439/852

(Continued)

FOREIGN PATENT DOCUMENTS

| CN | 102967905 | 3/2013 |
| WO | WO-2013165344 | 11/2013 |

OTHER PUBLICATIONS

PCT/ISA/KR, International Search Report dated Jul. 23, 2015, PCT/US2014/067669.

*Primary Examiner* — Stephen S Sul
(74) *Attorney, Agent, or Firm* — Hewlett Packard Enterprise Patent Department

(57) ABSTRACT

One example of a system includes a system board including first contacts, a cage attached to the system board over the first contacts, and a removable transceiver module including second contacts. The transceiver module is installable in the cage in response to a lateral movement of the transceiver module with respect to the cage to align the second contacts with the first contacts and a vertical movement of the transceiver module with respect to the cage to electrically connect the first contacts to the second contacts.

15 Claims, 18 Drawing Sheets

(51) Int. Cl.
*H05K 7/20* (2006.01)
*H05K 9/00* (2006.01)
*H01R 12/71* (2011.01)
*H04B 10/40* (2013.01)

(52) U.S. Cl.
CPC ......... *G02B 6/4269* (2013.01); *G02B 6/4277* (2013.01); *G02B 6/4278* (2013.01); *G02B 6/4284* (2013.01); *H05K 1/181* (2013.01); *H05K 7/2039* (2013.01); *H05K 9/0016* (2013.01); *G02B 6/4292* (2013.01); *H01R 12/714* (2013.01); *H04B 10/40* (2013.01); *H05K 2201/10121* (2013.01)

(58) Field of Classification Search
CPC .. G02B 6/4246; G02B 6/4269; G02B 6/4292; H05K 1/181; H05K 7/2039; H05K 9/0016; H05K 2201/10121; H01R 12/714; H04B 10/40
USPC .................. 361/679.54, 709, 715, 716, 719
See application file for complete search history.

(56) References Cited

U.S. PATENT DOCUMENTS

| | | | |
|---|---|---|---|
| 6,135,793 A * | 10/2000 | Babineau | H01R 13/65802 439/92 |
| 6,551,117 B2 | 4/2003 | Poplawski | |
| 6,713,672 B1 * | 3/2004 | Stickney | H05K 9/0018 174/382 |
| 6,816,376 B2 | 11/2004 | Bright | |
| 6,846,115 B1 | 1/2005 | Shang et al. | |
| 6,873,800 B1 | 3/2005 | Wei | |
| 6,916,122 B2 | 7/2005 | Branch | |
| 6,980,437 B2 | 12/2005 | Bright | |
| 6,986,679 B1 | 1/2006 | Aronson | |
| 7,073,960 B2 * | 7/2006 | Anderl | H04B 10/806 361/688 |
| 7,371,965 B2 | 5/2008 | Ice | |
| 8,068,338 B1 * | 11/2011 | Tamarkin | H05K 7/20145 174/16.1 |
| 8,376,634 B2 | 2/2013 | Oki | |
| 8,534,930 B1 * | 9/2013 | Lima | G02B 6/426 385/14 |
| 8,613,632 B1 * | 12/2013 | Nichols | H01R 13/6587 439/485 |
| 2002/0009905 A1 | 1/2002 | Poplawski | |
| 2003/0063450 A1 * | 4/2003 | Miller | H01L 23/13 361/783 |
| 2005/0018976 A1 | 1/2005 | Lee | |
| 2005/0036743 A1 * | 2/2005 | Dugas | G02B 6/428 385/75 |
| 2005/0220425 A1 * | 10/2005 | Kropp | G02B 6/4292 385/88 |
| 2006/0104572 A1 | 5/2006 | Yi et al. | |
| 2007/0258682 A1 * | 11/2007 | Bright | G02B 6/4292 385/55 |
| 2008/0298041 A1 * | 12/2008 | Teo | G02B 6/4246 361/818 |
| 2008/0315528 A1 | 12/2008 | Moore | |
| 2009/0296350 A1 | 12/2009 | Oki et al. | |
| 2010/0061069 A1 * | 3/2010 | Cole | G02B 6/4246 361/761 |
| 2011/0255832 A1 * | 10/2011 | Zhao | G02B 6/4201 385/88 |
| 2012/0182688 A1 * | 7/2012 | McColloch | H04B 10/40 361/692 |
| 2013/0051738 A1 | 2/2013 | Ito | |
| 2013/0077920 A1 * | 3/2013 | Matsue | G02B 6/4277 385/92 |
| 2013/0183862 A1 * | 7/2013 | Ni | H01R 12/71 439/620.22 |
| 2013/0194753 A1 * | 8/2013 | Wang | G02B 6/4261 361/720 |
| 2014/0010553 A1 * | 1/2014 | McColloch | H04B 10/14 398/139 |
| 2014/0206234 A1 * | 7/2014 | Mason | H01R 13/6581 439/607.35 |
| 2014/0321061 A1 * | 10/2014 | Moore | H05K 3/301 361/709 |
| 2015/0244108 A1 * | 8/2015 | Phillips | H01R 13/5219 439/271 |
| 2016/0149324 A1 * | 5/2016 | Regnier | H05K 7/20127 439/76.1 |
| 2016/0359278 A1 * | 12/2016 | Kachlic | G02B 6/4268 |
| 2018/0123268 A1 * | 5/2018 | Leigh | H01R 12/7005 |

* cited by examiner

TRANSCEIVER MODULE

Background

Hot-pluggable transceiver modules, such as 1-lane Small Form-Factor Pluggable (SFP), 4-lane Quad Small Form-Factor Pluggable (QSFP), and 12-lane CXP, are used for network data communications. The transceiver modules are hot-pluggable to a system board, such as a printed circuit board of a switch module. A system board is typically behind a faceplate where connectors for coupling communication cables (e.g., fiber optic cables) to the transceiver modules are arranged.

DETAILED DESCRIPTION

Figure 1:
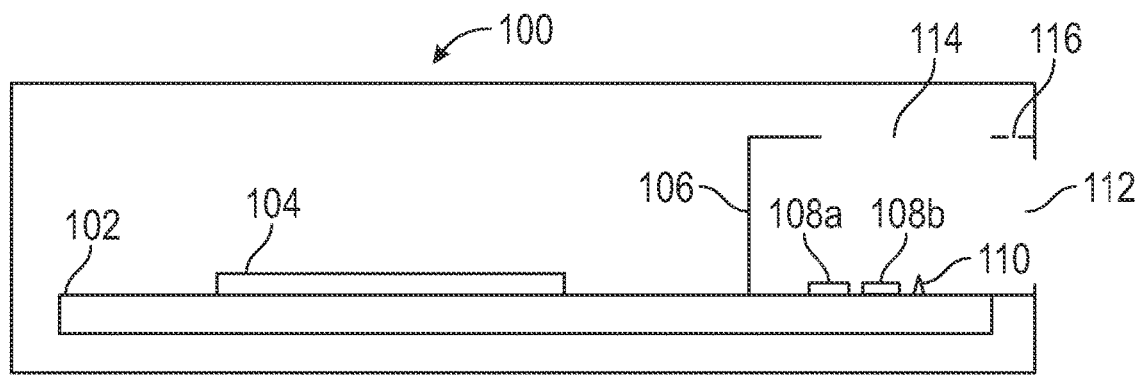
FIG. 1 illustrates a cross-sectional view of one example of a system for receiving a transceiver module.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

A transceiver module includes a set of components for receiving communication signals from a first side of the module, a set of components for transmitting communication signals to the first side of the module, a set of components for transmitting communication signals to a second side of the module, and a set of components for receiving communication signals from the second side of the module. The transmitting and receiving components for the first side of the module may be electronic components. The transmitting and receiving components for the second side of the module may be electro-optical components.

Conventional hot-pluggable transceiver modules, such as 1-lane Small Form-Factor Pluggable (SFP), 4-lane Quad Small Form-Factor Pluggable (QSFP), and 12-lane CXP, are difficult to cool and occupy a significant amount of space on a system board, thereby limiting the use of other electronic components on the system board. The transceiver modules are typically coupled to a system board via right-angled blindmate connectors, which also occupy significant space on a system board, thereby limiting the implementation of high lane-count transceivers (e.g., beyond 16 lanes). To minimize the system board space usage, the 12-lane CXP and the 16-lane CDFP pluggable transceiver modules use two PCBs—one PCB is for transmitter components and the other PCB is for receiver components. The transceiver modules also occupy a significant amount of faceplate space, thereby limiting the connector density. Each transceiver module has a fixed lane count. Therefore, break-out cables (e.g., a QSFP to four SFPs) are used to connect a larger lane-count pluggable transceiver module to smaller lane-count systems.

Accordingly, this disclosure describes Variable Lane-count Pluggable (VLP) transceiver modules and systems for receiving the VLP transceiver modules. A VLP transceiver module as described herein may be hot-pluggable and thus transceivers may be easily replaced for servicing or for different lane-count transceivers and/or different lane-count cable connectors. A system for receiving a VLP transceiver module includes a system board (e.g., Printed Circuit Board (PCB)) and a cage mounted on the system board that can accept varying lane-count transceiver modules by using the surface of the system board for contacts (i.e., pad array or chip socket).

FIG. 1 illustrates a cross-sectional view of one example of a system 100 for receiving a transceiver module. System 100 includes a system board 102 (e.g., a PCB), a network chip 104 (e.g., an Application Specific Integrated Circuit (ASIC)), and a cage 106. Network chip 104 is electrically coupled to system board 102. System board 102 includes a plurality of contacts 108a and 108b (collectively referred to as contacts 108) electrically coupled to network chip 104 via system board 102. Contacts 108 are used to electrically couple a transceiver module to system board 102 when a transceiver module is installed in system 100. System board 102 may include a sliding lid tab 110 to open a sliding lid of a transceiver module when a transceiver module is installed in system 100.

Cage 106 is attached to system board 102 over contacts 108 and sliding lid tab 110 to receive a transceiver module. Cage 106 includes a latch receiving mechanism 116. Cage 106 includes a first opening 112 for installing a transceiver module into system 100 and a second opening 114 for exposing an installed transceiver module to air flow for cooling the transceiver module. Cage 106 may receive a VLP transceiver module.

Figure 2:
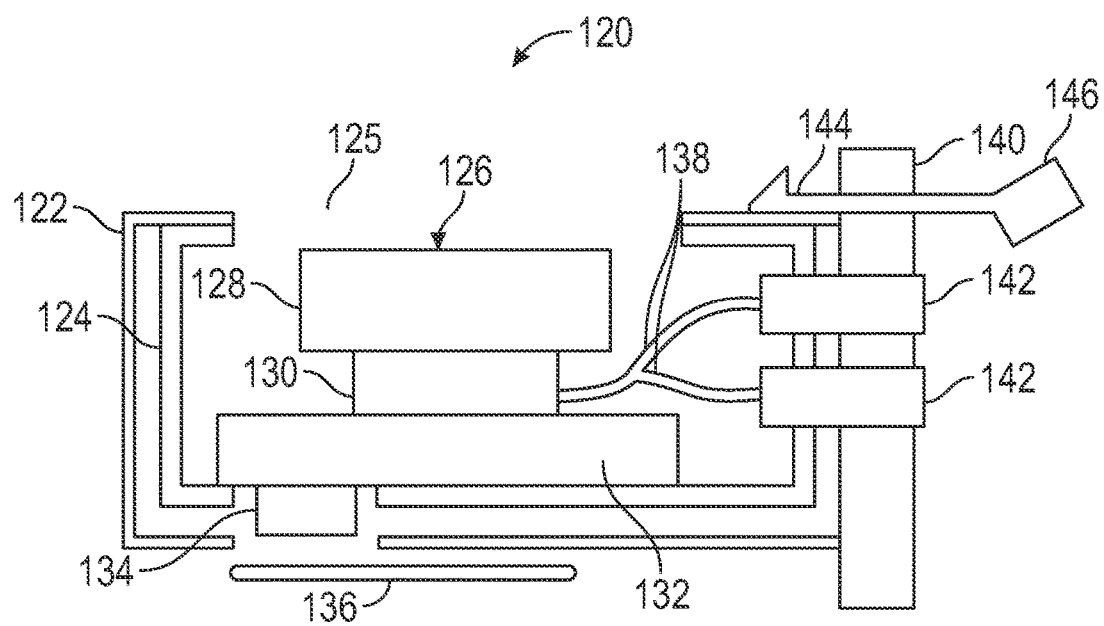
FIG. 2 illustrates a cross-sectional view of one example of a transceiver module.

FIG. 2 illustrates a cross-sectional view of one example of a transceiver module 120. Transceiver module 120 is a removable transceiver module, such as a VLP transceiver module. Transceiver module 120 includes a module hood 122, a module carrier 124, a substrate assembly 126, and a cable bulkhead 140. Cable bulkhead 140 is attached to module hood 122. Cable bulkhead 140 includes connectors 142 (e.g., optical connectors) for connecting communication cables to transceiver module 120.

Module hood 122 supports module carrier 124, which is movable with respect to module hood 122. Module carrier 124 supports substrate assembly 126. Substrate assembly 126 includes a heat sink 128, a transceiver chip 130, and a substrate 132 (e.g., a PCB). Substrate 132 includes contacts 134 for electrically coupling transceiver module 120 to a system board when transceiver module 120 is installed in a system. Heat sink 128 is attached to the top of transceiver chip 130, and the bottom of transceiver chip 130 is attached to the top of substrate 132. Transceiver chip 130 is communicatively coupled (i.e., optically) to connectors 142 through communication cables 138 (e.g., optical fibers) and electrically coupled to contacts 134 via substrate 132.

Module hood 122 may include a latch mechanism 144. When module hood 122 is installed in cage 106, latch mechanism 144 engages with latch receiving mechanism 116 of cage 106. Similarly, latch mechanism 144 disengages from latch receiving mechanism 116 of cage 106 when module hood 122 is to be removed from cage 106. In one example, a latch tab 146 can be pulled to deactivate the latch mechanism 144.

In one example, module carrier 124 includes a sliding lid 136. Sliding lid 136 may be closed to protect contacts 134 when transceiver module 120 is not installed in a system. Sliding lid 136 is opened to expose contacts 134 when transceiver module 120 is installed in a system. In other examples, sliding lid 136 may be excluded.

Transceiver module 120 may have various configurations including a 1-lane transceiver, a 4-lane transceiver, an 8-lane transceiver, a 12-lane transceiver, a 24-lane transceiver, or combination thereof, on one PCB. Based on the selected transceiver module configuration, contacts 134 of substrate 132 may include contacts for power, ground, data, and management signals.

Figure 3A:
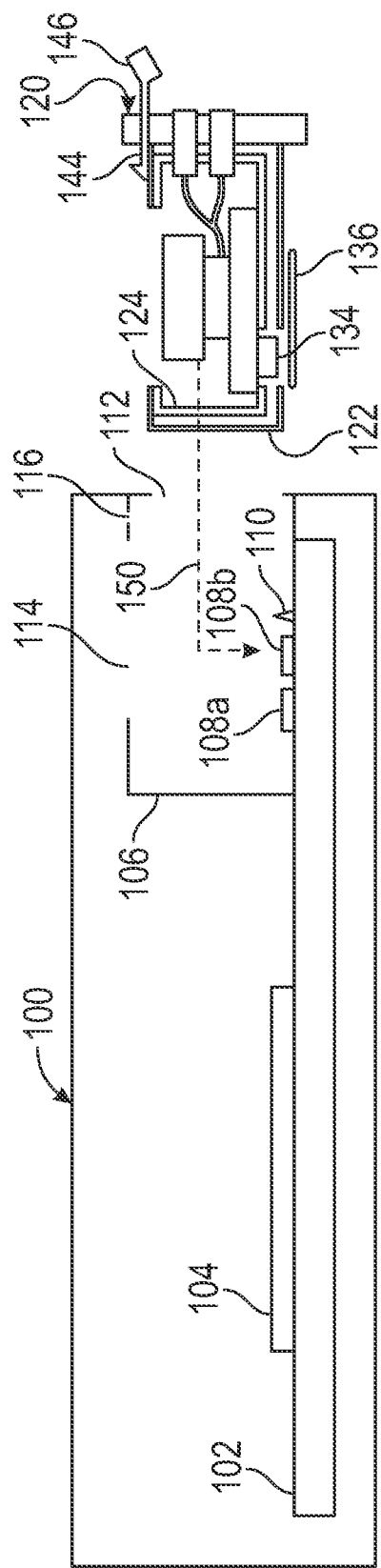
FIG. 3A illustrates a cross-sectional view of one example of a transceiver module being installed in a system.

FIG. 3A illustrates a cross-sectional view of one example of a transceiver module 120 being installed in a system 100. The transceiver module installation path is indicated at 150. Transceiver module 120 is inserted laterally into cage 106 through cage opening 112. During insertion of transceiver module 120, sliding lid tab 110 of system board 102 forces sliding lid 136 of transceiver module 120 to open to expose contacts 134. At the point where contacts 134 of transceiver module 120 are aligned with corresponding contacts 108a of system board 102, module carrier 124 is moved vertically to blindmate contacts 134 of transceiver module 120 with contacts 108a of system board 102. Lateral insertion of module hood 122 into cage opening 112 conveys a vertical motion to module carrier 124 once contacts 134 of transceiver module 120 are aligned with corresponding contacts 108a of system board 102. In this way, transceiver module 120 may be installed into system 100 using one continuous lateral movement of module hood 122 into cage 106.

Figure 3B:
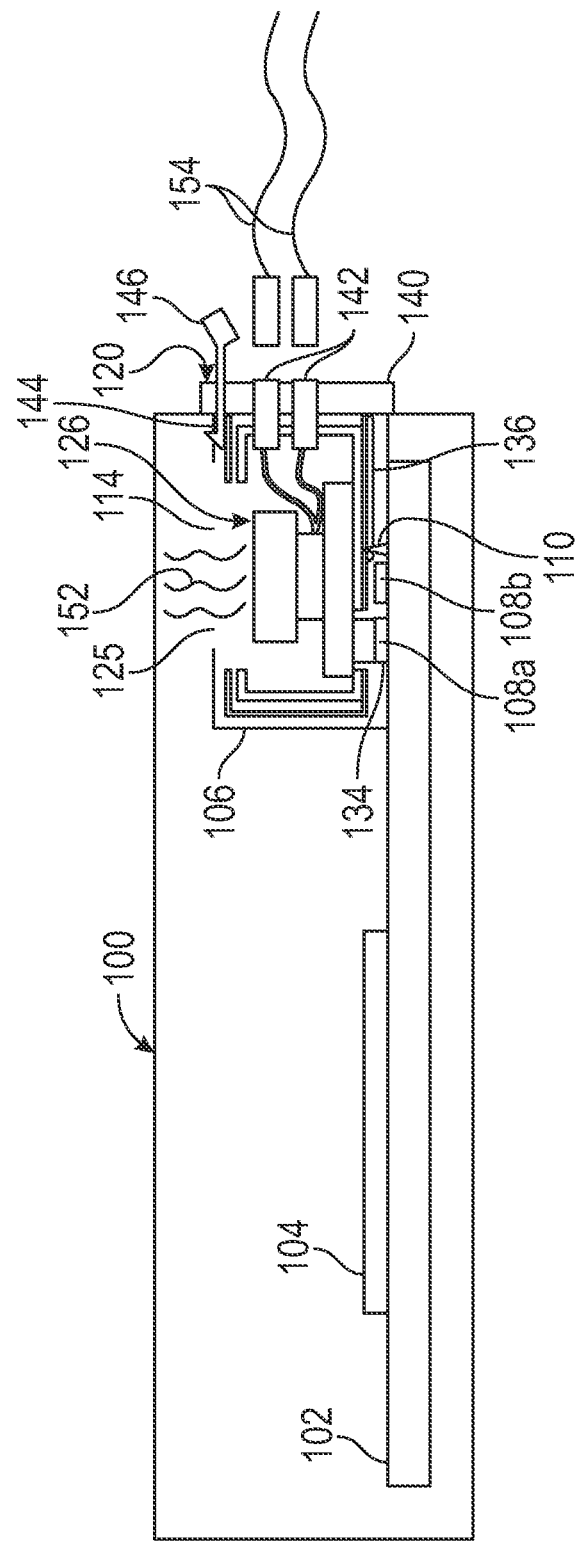
FIG. 3B illustrates a cross-sectional view of one example of a transceiver module installed in a system.

FIG. 3B illustrates a cross-sectional view of one example of a transceiver module 120 installed in a system 100. With transceiver module 120 fully installed in cage 106, sliding lid 136 is open and contacts 134 of transceiver module 120 are electrically coupled to contacts 108a of system board 108a. In this example, transceiver module 120 does not use contacts 108b of system board 102. In other examples, for other transceiver modules, both contacts 108a and 108b may be used for transceivers with having a higher number of lanes. With transceiver module 120 fully installed, communication cables 154 may be connected to connectors 142 on cable bulkhead 140 of transceiver module 120. Opening 125 of transceiver module 120 and opening 114 of cage 106 allow air flow to substrate assembly 126 for cooling transceiver module 120 as indicated at 152.

In one example, transceiver module 120 includes latch mechanism 144 that can be activated to retain the transceiver module after the transceiver module is installed in cage 106. Latch mechanism 144 can be deactivated to release the transceiver module so the transceiver module can be removed from cage 106. Latch receiving mechanism 116 and latch mechanism 144 are excluded from the remaining figures for simplicity. It should be understood that transceiver module 120 is secured by latch mechanism 144 and latch receiving mechanism 116 after the transceiver module is fully blindmated within cage 106, and transceiver module 120 can be removed by deactivating latch mechanism 144.

Figure 4:
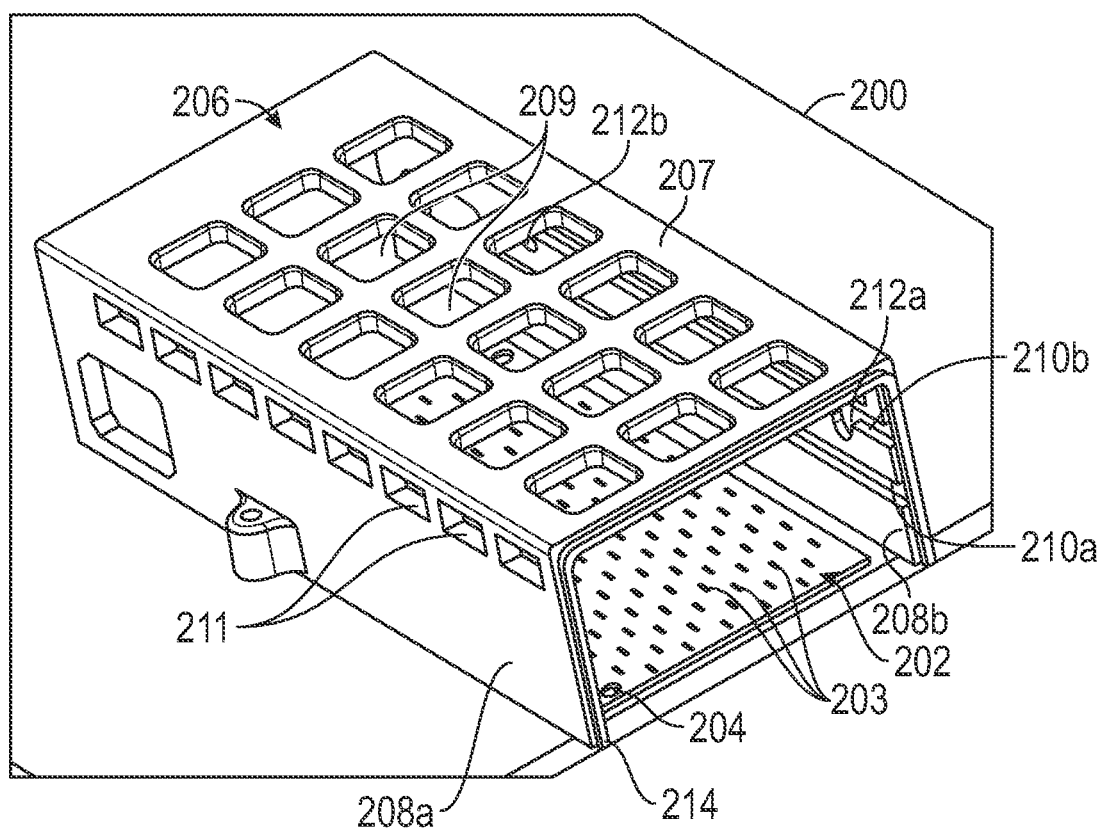
FIG. 4 illustrates one example of a cage mounted on a system board for receiving a transceiver module.

FIG. 4 illustrates one example of a cage 206 mounted on a system board 200 for receiving a transceiver module. System board 200 includes a socket 202. Socket 202 includes a plurality of contacts 203 to electrically couple to a transceiver module and alignment holes 204 to align a transceiver module with socket 202. Cage 206 is attached to system board 200 over socket 202. Cage 206 includes a top wall 207 extending between a first side wall 208a and a second side wall 208b. An Electromagnetic Interference (EMI) gasket 214 extends over the edge of first sidewall 208a, top wall 207, and second sidewall 208b. Top wall 207 includes a plurality of openings 209 to allow air to flow to a transceiver module installed in cage 206. In one example, each side wall 208a and 208b also includes a plurality of openings 211.

Each side wall 208a and 208b includes first guide rails 210a and 210b parallel to system board 200 (the guide rails on first side wall 208a are not visible in FIG. 4). Each side wall 208a and 208b also includes second guide rails connected to and perpendicular to first guide rails 210a and 210b (e.g., 212a and 212b for guide rail 210b). First guide rails 210a and 210b laterally guide a transceiver module into cage 206 to align contacts of the transceiver module with corresponding contacts 203 of socket 202. Second guide rails 212a and 212b vertically guide a transceiver module within cage 206 to electrically couple the contacts of the transceiver module with corresponding contacts 203 of socket 202.

Figure 5A:
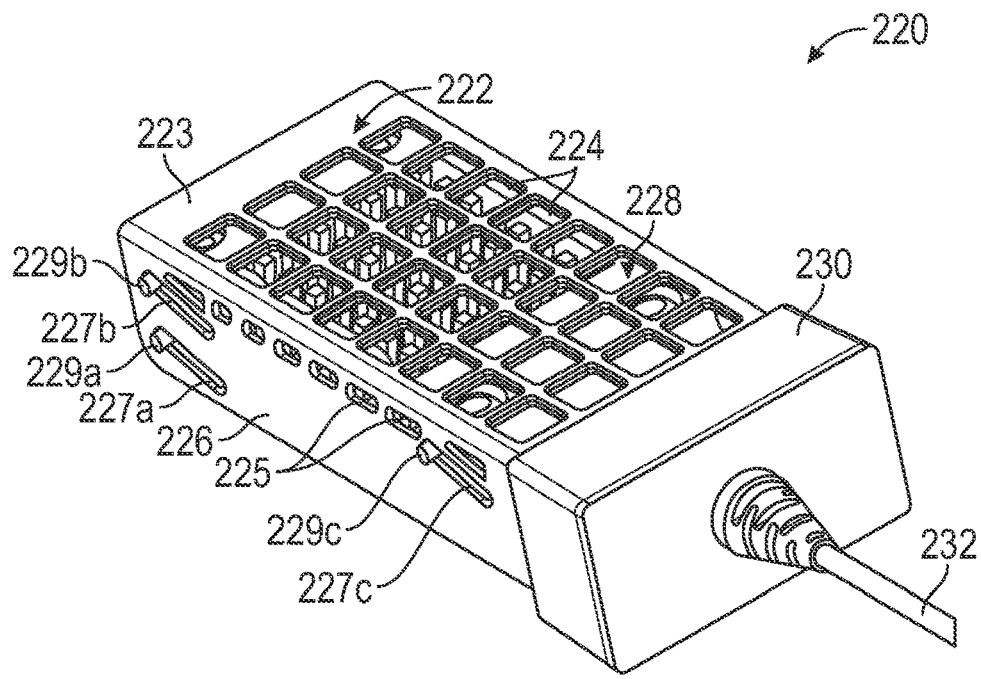
FIG. 5A illustrates one example of a transceiver module.

FIG. 5A illustrates one example of a transceiver module 220. Transceiver module 220 may be installed in cage 206 previously described and illustrated with reference to FIG. 4. Transceiver module 220 includes a module hood 222, a module carrier 228, and a cable bulkhead 230. Cable bulkhead 230 is attached to module hood 222. Cable bulkhead 230 is coupled to a communication cable 232.

Module hood 222 includes a top wall 223 extending between a first sidewall 226 and a second sidewall (not visible in FIG. 5A). Top wall 223 includes a plurality of openings 224 to allow heated air to be vented from module carrier 228 enclosed by module hood 222. In one example, first sidewall 226 and the second sidewall also include a plurality of openings 225 to allow air to flow to module carrier 228 enclosed by module hood 222. The first sidewall 226 and the second sidewall of module hood 222 include slots 227a-227c, which are angled with respect to the sidewalls. In this example, slots 227a and 227b are toward the back end of transceiver module 220 and slot 227c is toward the front end of transceiver module 220. In other examples, the number and location of the slots may vary. Module carrier 228 includes guide pins 229a-229c, which extend through corresponding slots 227a-227c. Guide pins 229a are received by guide rails 210a and guide pins 229b and 229c are received by guide rails 210b of cage 206 (FIG. 4) when transceiver module 220 is installed in cage 206.

Figure 5B:
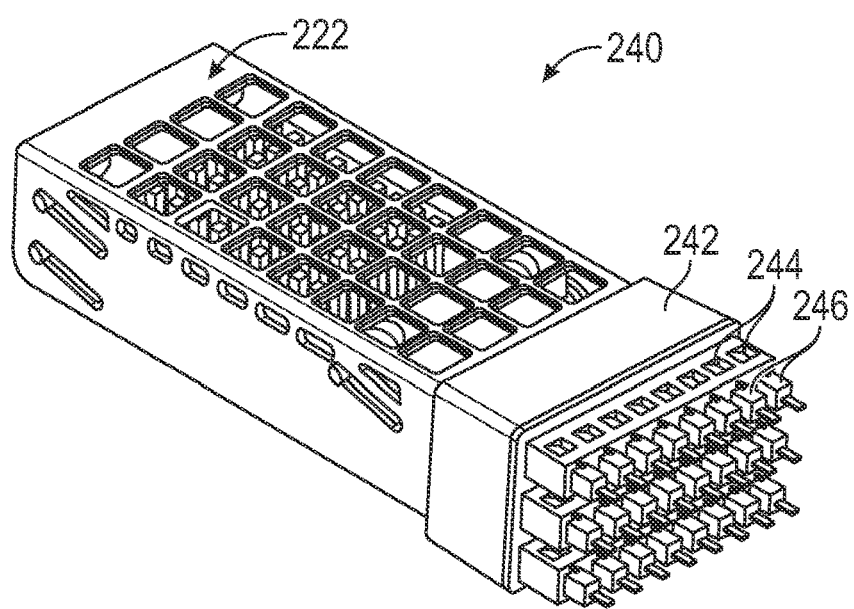
FIG. 5B illustrates another example of a transceiver module.

FIG. 5B illustrates another example of a transceiver module 240. Transceiver module 240 is similar to transceiver module 220 previously described and illustrated with reference to FIG. 5A, except that transceiver module 240 includes a cable bulkhead 242 in place of cable bulkhead 230. Cable bulkhead 242 includes a plurality of optical cable connectors 244 (i.e., 24 in this example). Each optical cable connector 244 may be optically coupled to a fiber optic cable 246. In other examples, cable bulkhead 242 may include another suitable number of optical cable connectors for optically coupling to fiber optic cables based on the transceiver(s) of transceiver module 240.

Figure 6:
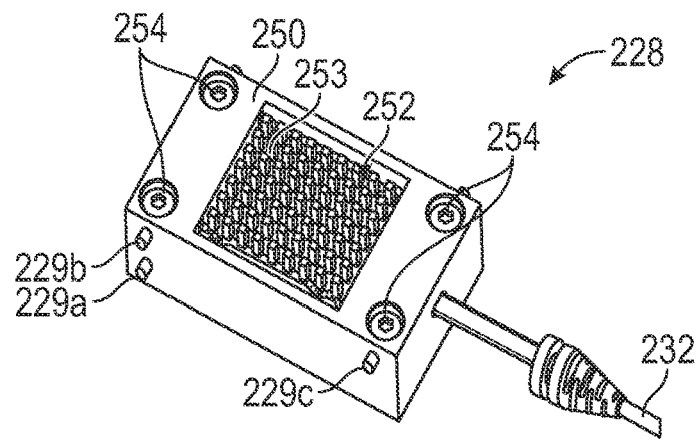
FIG. 6 illustrates one example of a module carrier.

FIG. 6 illustrates one example of a module carrier 228. Module carrier 228 includes a housing 250, which supports a substrate assembly 252. Housing 250 is attached to substrate assembly 252 via bolts 254 and includes an opening to expose a heat sink 253 of substrate assembly 252. Housing 250 also includes guide pins 229a-229c as previously described. Communication cable 232 is communicatively coupled to substrate assembly 252 through an opening through housing 250

Figure 7A:
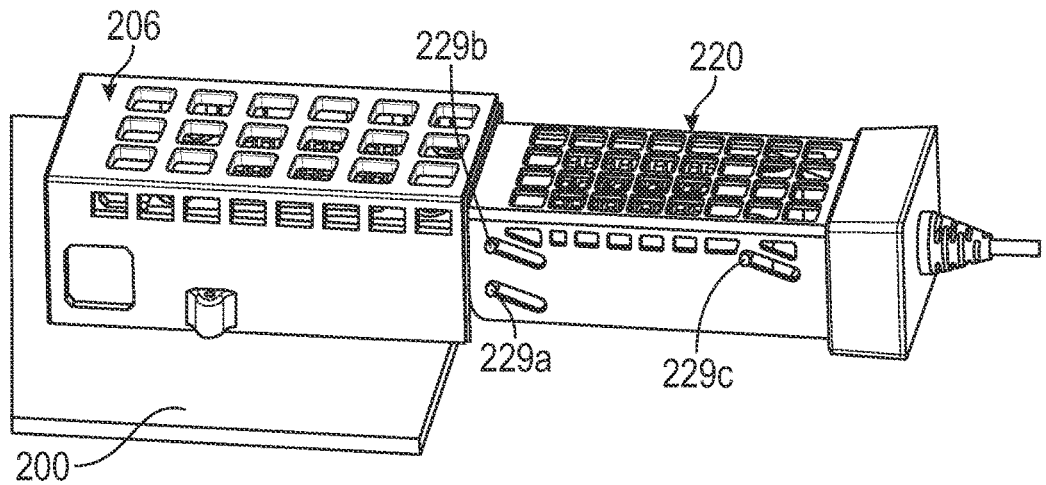
FIG. 7A illustrates one example of a transceiver module being installed in a cage.

FIG. 7A illustrates one example of a transceiver module 220 being installed in a cage 206. Guide pins 229a-229c are aligned with guide rails 210a and 210b (FIG. 4) and transceiver module 220 is slid laterally into cage 206 along the guide rails.

Figure 7B:
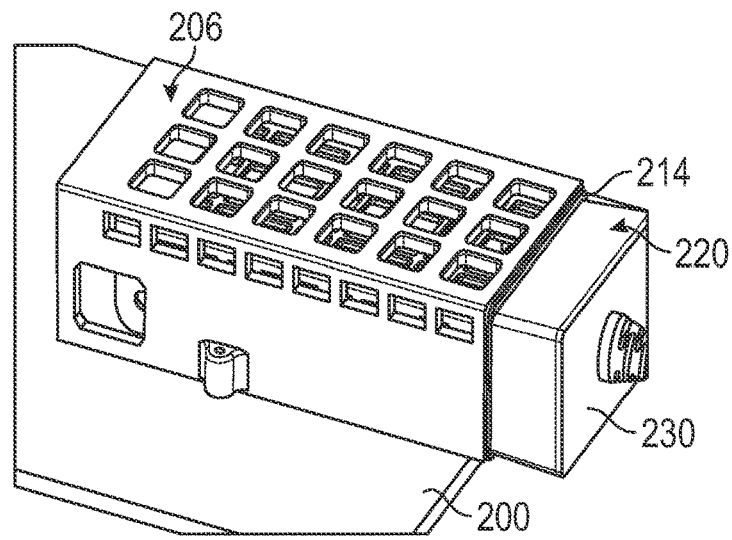
FIG. 7B illustrates one example of a transceiver module installed in a cage.

FIG. 7B illustrates one example of a transceiver module 220 installed in a cage 206. With transceiver module 220 installed in cage 206, EMI gasket 214 contacts cable bulkhead 230 to prevent air flow and EMI leakage between cable bulkhead 230 and cage 206. The openings through the top and sidewalls of cage 206 and the top and sidewalls of the module hood expose the heat sink of the substrate assembly such that transceiver module 220 is adequately cooled by air flow within the system.

Figure 8A:
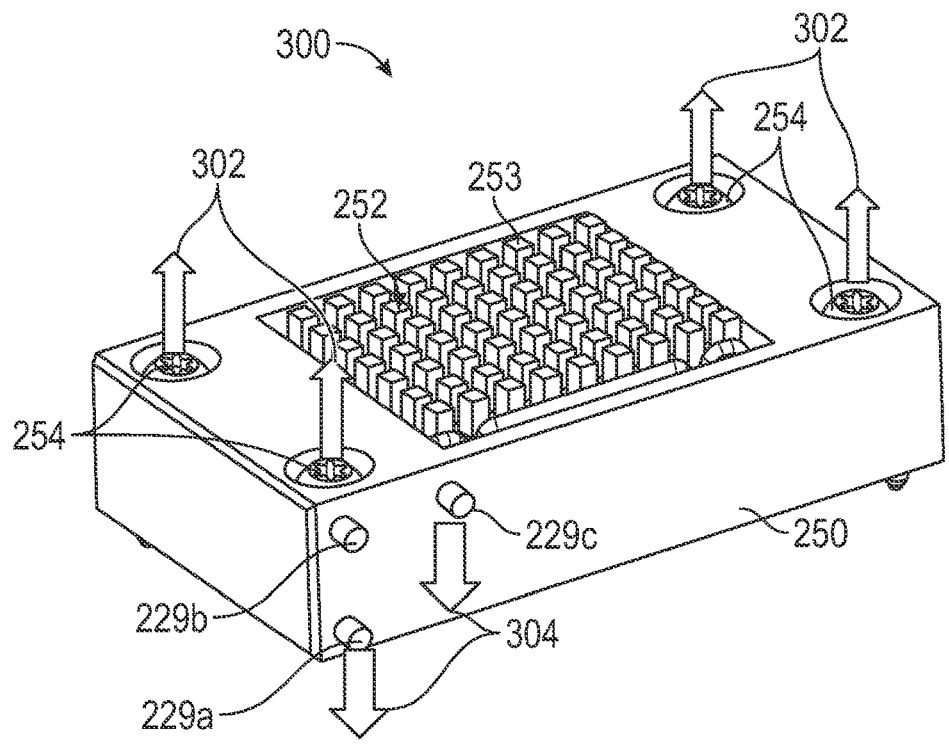
FIGS. 8A and 8B illustrate one example of a module carrier.
Figure 8B:
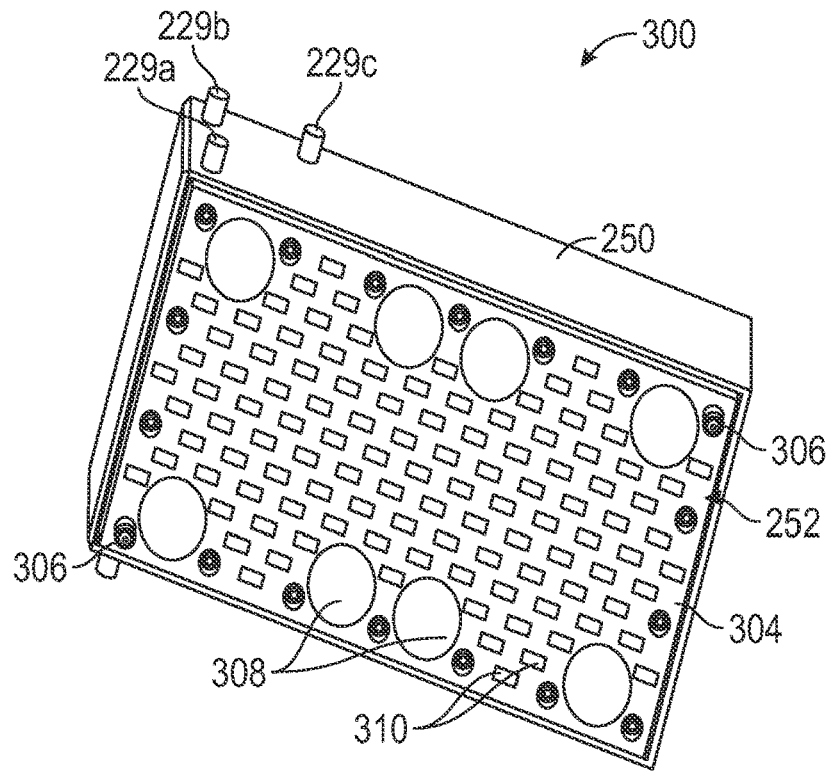

FIGS. 8A and 8B illustrate one example of a module carrier 300. Module carrier 300 includes a housing 250, which supports a substrate assembly 252 via bolts 254. Housing 250 includes guide pins 229a-229c on each side of housing 250. Substrate assembly 252 includes a heat sink 253, a transceiver chip (not visible), and a substrate 304. Substrate 304 includes contacts 308 and 310. In one example, contacts 308 are ground contacts and contacts 310 are signal contacts. Substrate 304 also includes alignment pins 306. Arrows 302 indicate a counterforce applied by bolts 254 to module carrier 300, while module carrier 300 is forced downward in the direction of arrows 304 when module hood 222 continues to travel in the lateral direction inside cage 206 as will be described with reference to FIG. 9A.

Figure 9A:
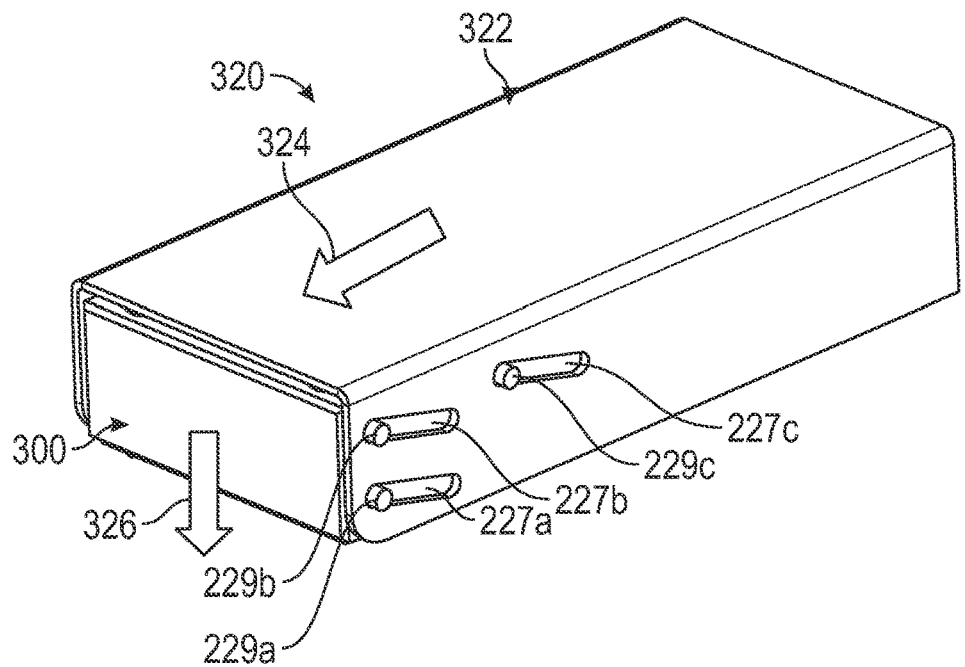
FIGS. 9A and 9B illustrate one example of a transceiver module including a module carrier within a module hood.
Figure 9B:
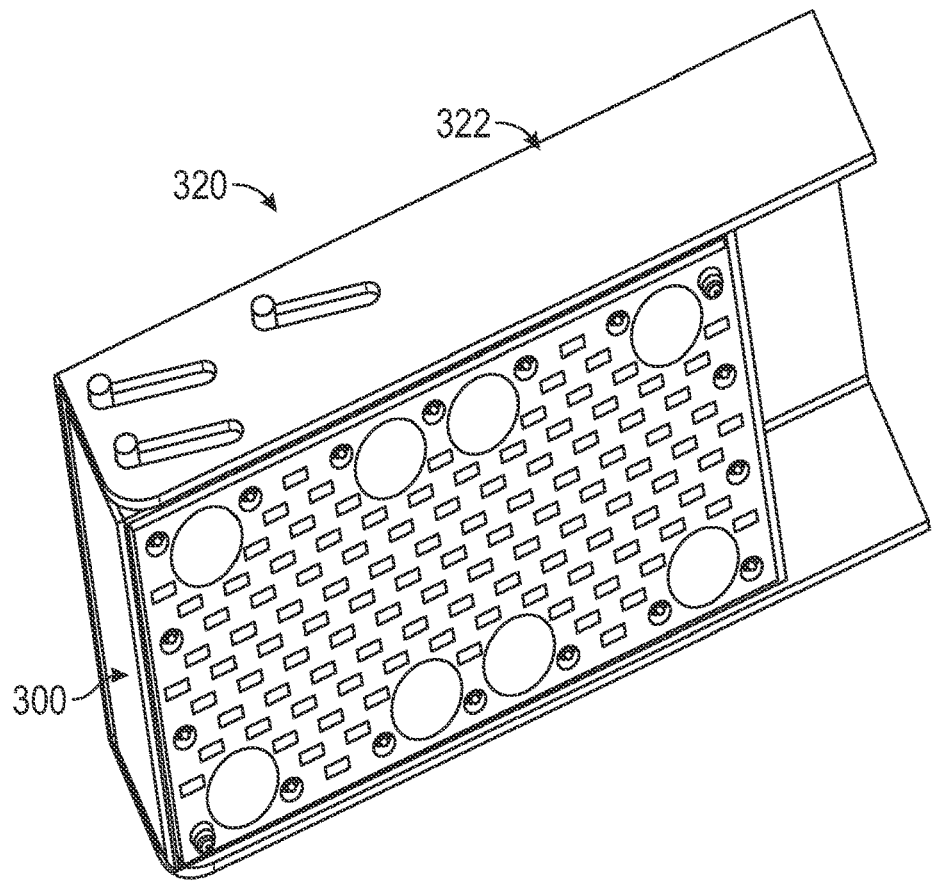

FIGS. 9A and 9B illustrate one example of a transceiver module 320 including a module carrier 300 within a module hood 322. Module hood 322 includes angled slots 227a-227c. Guide pins 229a-229c extend through angled slots 227a-227c, respectively. As such, lateral movement of module hood 322 with respect to module carrier 300 as indicated by arrow 324 conveys vertical movement of module carrier 300 with respect to module hood 322 as indicated by arrow 326. Other angled slots and guide pin designs and locations may be used depending on the form factor of the module carrier, the substrate design (e.g., contact pad count), and the amount of force needed to properly mate the substrate assembly to a socket.

Figure 10:
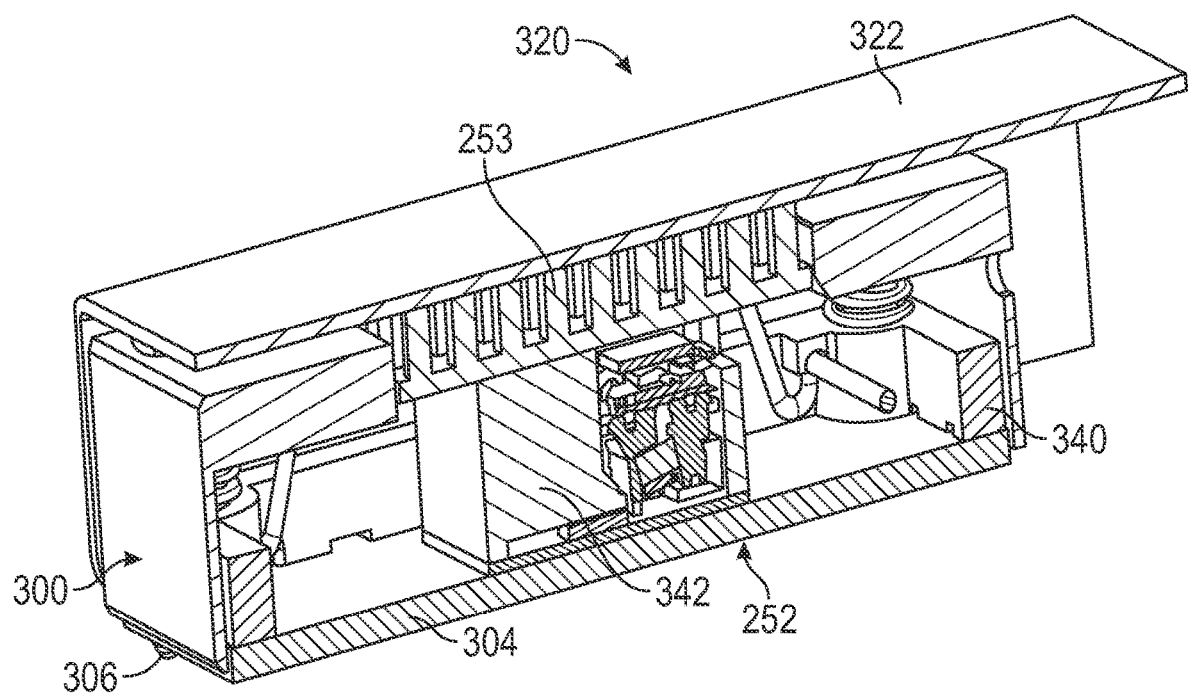
FIG. 10 illustrates a cross-sectional view of one example of a transceiver module.

FIG. 10 illustrates a cross-sectional view of one example of transceiver module 320. Transceiver module 320 includes module hood 322, module carrier 300, and substrate assembly 252. Substrate assembly 252 includes a heat sink 253, a transceiver 342, a substrate 304, and a substrate frame 340. Heat sink 253 is attached to transceiver 342, and transceiver 342 is electrically coupled to substrate 304. Substrate 304 is attached to substrate frame 340, which extends around the edges of substrate 304 to surround transceiver 342. Substrate frame 340 is attached to module carrier 300 via bolts 254 (FIG. 8A).

Figure 11:
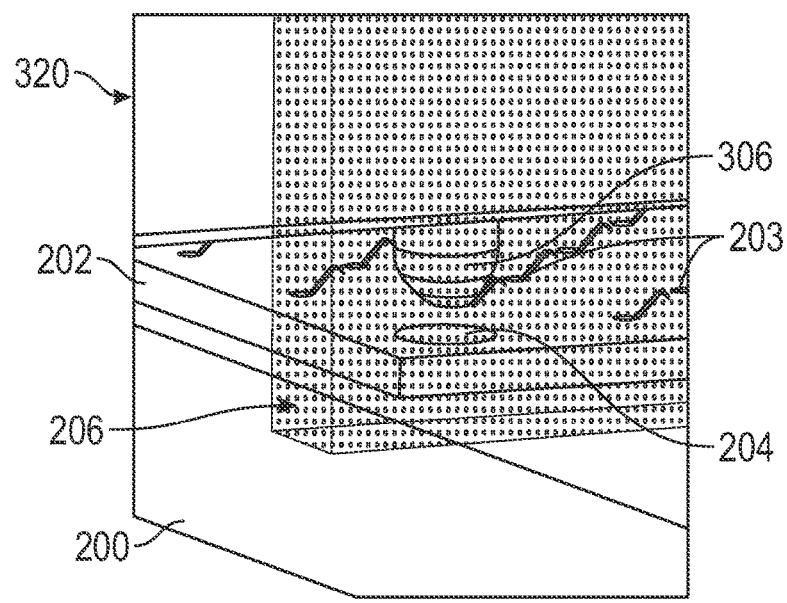
FIG. 11 illustrates an enlarged view of one example of an alignment pin of a transceiver module and a corresponding alignment hole of a socket of a system board.

FIG. 11 illustrates an enlarged view of one example of an alignment pin 306 of a transceiver module 320 and a corresponding alignment hole 204 of a socket 202 of a system board 200. A partial and transparent view of cage 206 is also illustrated in FIG. 11. FIG. 11 further illustrates the alignment of one alignment hole 204 with an alignment pin 306 prior to the vertical movement of transceiver module 320 that will insert alignment pin 306 into alignment hole 204 such that contacts 203 of socket 202 electrically couple to the contacts of transceiver module 320. Multiple substrate alignment pins may be used for early lead-in into alignment holes of a socket. In other examples, the alignment pins of the substrate and alignment holes of the socket may be reversed such that the substrate includes the alignment holes and the socket includes the alignment pins. In other examples, other suitable features for alignment, such as chamfered lips, may be used in addition to or in place of the alignment pins and alignment holes such that alignment features of the transceiver module engage with alignment features of the system board.

Figure 12A:
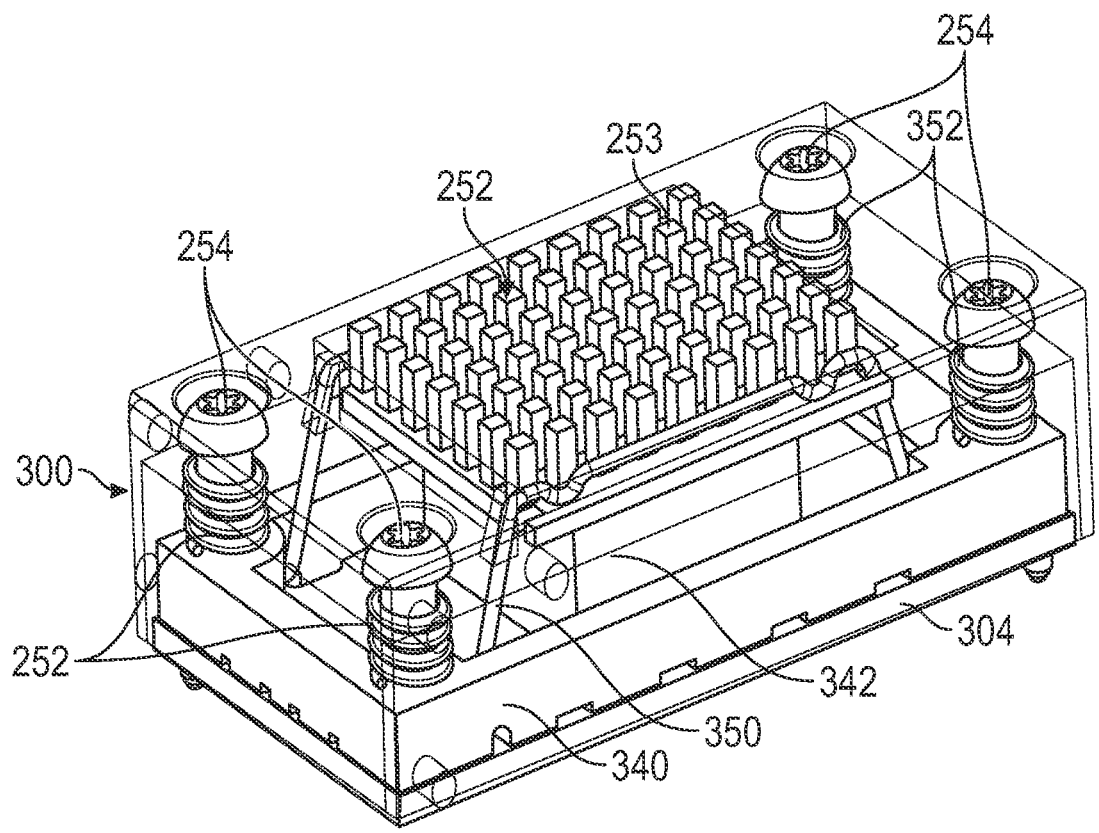
FIG. 12A illustrates a perspective view and FIG. 12B illustrates a cross-sectional view of one example of a substrate assembly within a module carrier.
Figure 12B:
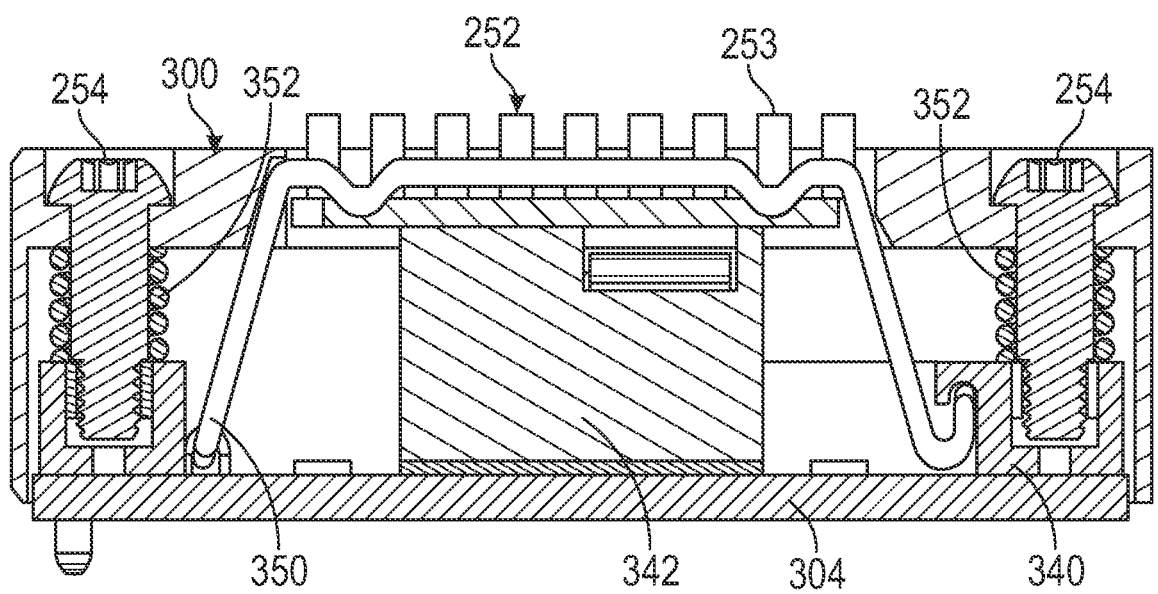

FIG. 12A illustrates a perspective view and FIG. 12B illustrates a cross-sectional view of one example of a substrate assembly 252 within a module carrier 300. Heat sink 253 is retained by a heat sink retention spring 350, which is retained by substrate frame 340. Frame springs 352 surround each bolt 254 between module carrier 300 and substrate frame 340 in each of the four corners of module carrier 300 and substrate assembly 252. Frame springs 352 apply a force between module carrier 300 and substrate frame 340.

Substrate frame 340 ensures that even force is applied to substrate 304 for proper blindmating of substrate 304 to a socket when downward force is applied on the substrate frame by the frame springs 352. Module carrier 300 can be pushed down to compress frame springs 352 to overdrive substrate assembly 252 onto a socket. The bottom surface of the heads of frame bolts 254 provide a stop for module carrier 300 when frame springs 352 are not compressed.

Although one substrate assembly with one transceiver and associated heat sink is illustrated in FIGS. 12A and 12B, in other examples, multiple substrate assemblies attached to the substrate frame may be used. Each substrate assembly may mate to a corresponding socket or to a multi-cavity socket.

Figure 13A:
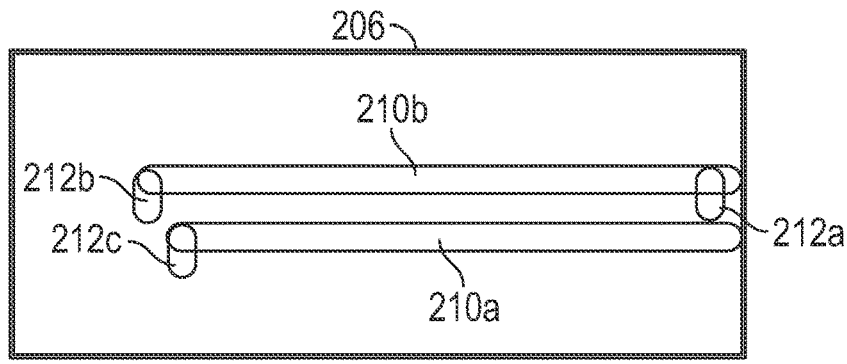
FIG. 13A-13B illustrate an exploded view of one example of a system board and a cage.
Figure 13B:
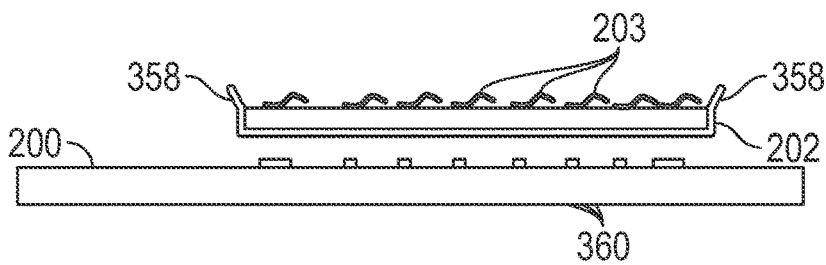

FIGS. 13A-13B illustrate an exploded view of one example of a system board and a cage. FIG. 13A illustrates one example of a cage 206. Cage 206 includes horizontal rails 210a-210b and vertical rails 212a-212c upon which the guide pins of a module carrier ride when a transceiver module is inserted into the cage. Horizontal rails 210a-210b start at the opening of cage 206 and transition to vertical rails 212a-212c deeper inside cage 206.

FIG. 13B illustrates an exploded view of one example of a system board 200 and a socket 202. System board 200 includes contacts 360 for socket 202. Socket 202 includes contacts 203, which are electrically coupled to contacts 360 of system board 200 when socket 202 is installed on system board 200. In one example, socket 202 includes lips 358 with chamfered features for lead-in. In other examples, socket 202 is a flat interposer.

Figure 14A:
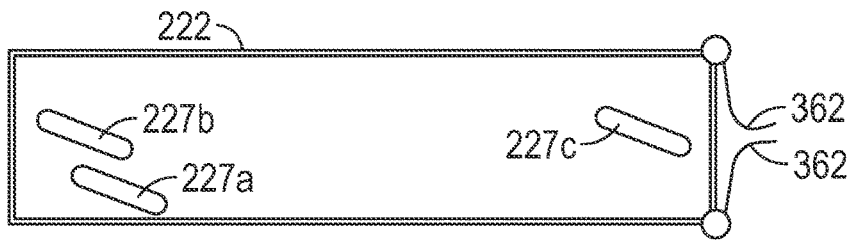
FIGS. 14A-14C illustrate an exploded view of one example of a transceiver module.
Figure 14B:
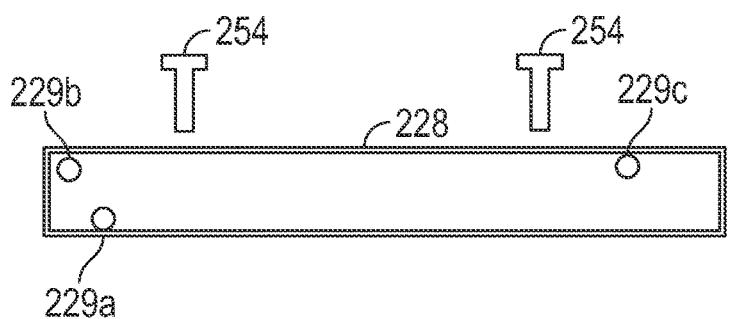
Figure 14C:
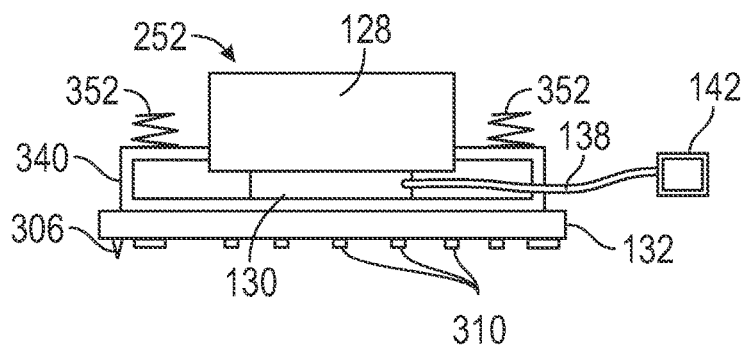

FIGS. 14A-14C illustrate an exploded view of one example of a transceiver module. FIG. 14A illustrates one example of a module hood 222. Module hood 222 includes angled slots 227a-227c. The opening of module hood 222 includes hood doors 362. Hood doors 362 protect the openings of optical connectors (e.g., for dust, eye safety) or provide for cable management. FIG. 14B illustrates an exploded view of one example of a module carrier 228 and frame bolts 254. Module carrier 228 includes guide pins 229a-229c. Guide pins 229a-229c of module carrier 228 extend through angled slots 227a-227c of module hood 222, respectively, when module carrier 228 is installed within module hood 222. FIG. 14C illustrates one example of a substrate assembly 252. Substrate assembly 252 includes a heat sink 128, a transceiver chip 130, an optical cable 138, an optical connector 142, a substrate 132 including alignment pins 306 and contacts 310, a substrate frame 340, and springs 352. Substrate assembly 252 is attached to module carrier 228 via bolts 254, which extend through springs 352 to attach to substrate frame 340.

The transceiver module including module hood 222 is moved laterally into cage 206 (FIG. 13A), which in turn moves module carrier 228 and substrate assembly 252 laterally into cage 206. Angled slots 227a-227c in conjunction with horizontal rails 210a-210b and vertical rails 212a-212c cause module carrier 228 to travel horizontally or vertically within cage 206 depending on the location of module carrier 228 within cage 206.

Figure 15A:
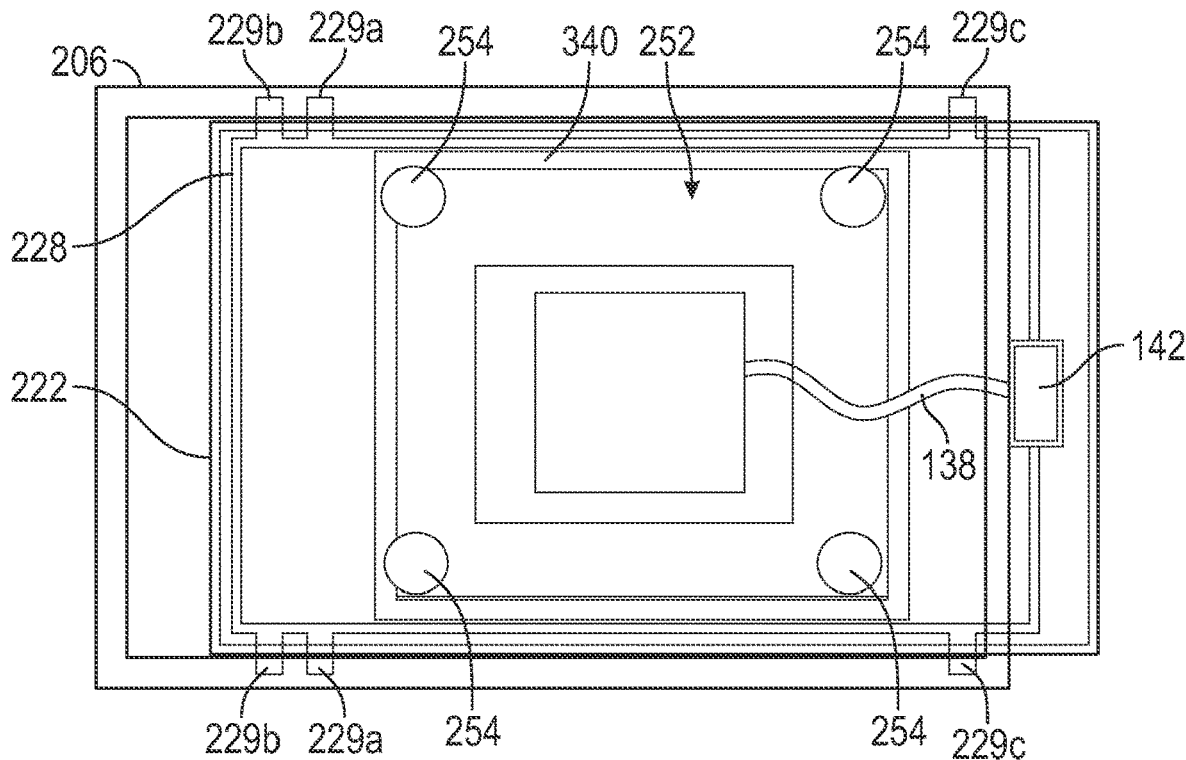
FIG. 15A illustrates a top view.
Figure 15B:
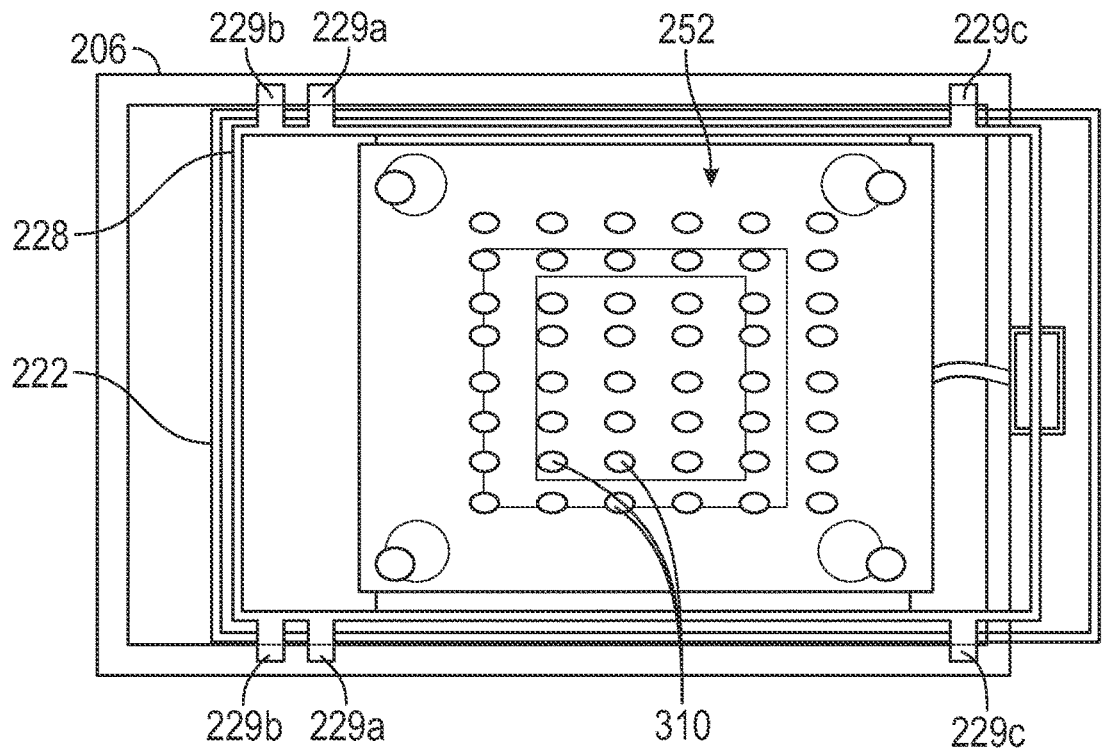
FIG. 15B illustrates a bottom view.
Figure 15C:
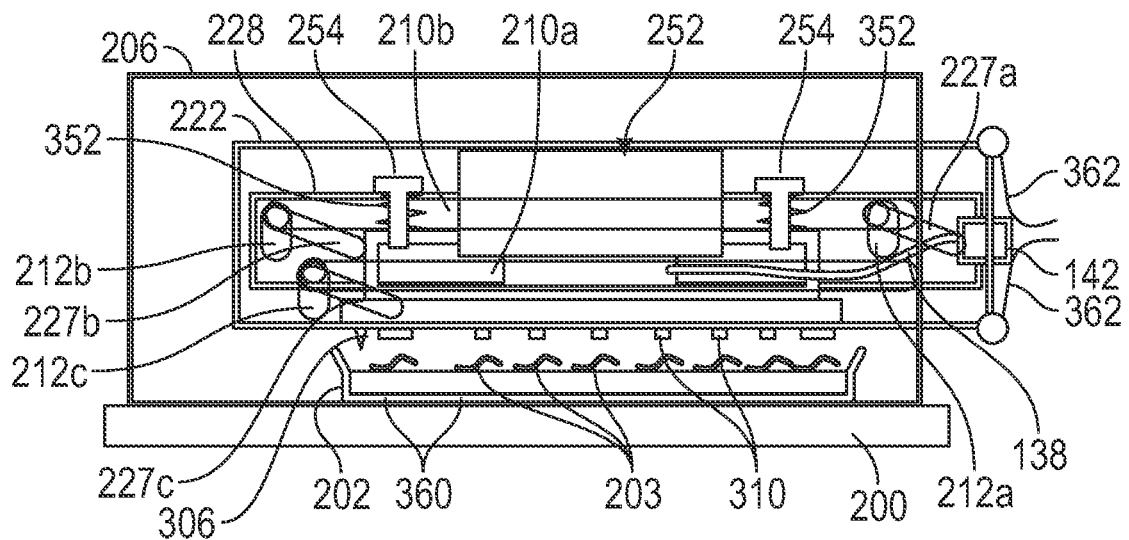
FIG. 15C illustrates a side view.
Figure 15D:
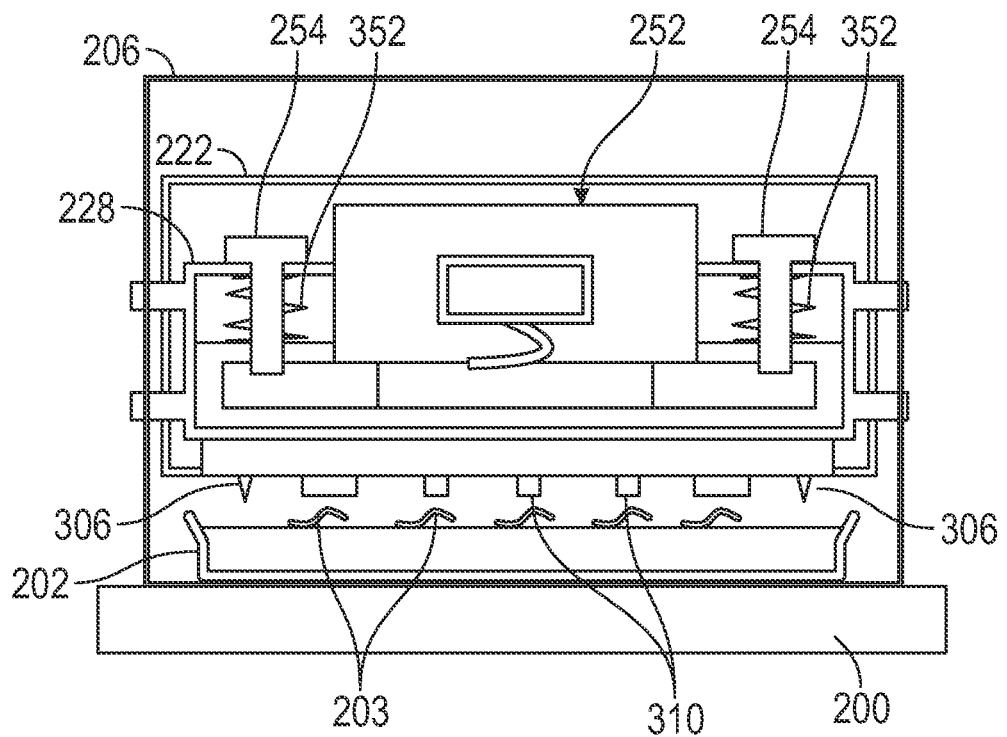
FIG. 15D illustrates a front view of one example of a transceiver module in a cage.

FIG. 15A illustrates a top view, FIG. 15B illustrates a bottom view, FIG. 15C illustrates a side view, and FIG. 15D illustrates a front view of one example of a transceiver module in a cage. The components previously described and illustrated with reference to FIGS. 13A-13B and 14A-14C are assembled such that substrate assembly 252 is attached to module carrier 228 via frame bolts 254. Module carrier 228 is movably attached to module hood 222 via guide pins 229a-229c of module carrier 228 extending through angled slots 227a-227c of module hood 222, respectively. The transceiver module including module hood 222 and module carrier 228 is inserted into cage 206 such that guide pins 229a-229c of module carrier 228 are guided by horizontal rails 210a-210b and vertical rails 212a-212c of cage 206. As illustrated in FIGS. 15C and 15D, in this example, the transceiver module has been inserted laterally into cage 206 up to the point where contacts 310 of substrate assembly 252 are aligned with contacts 203 of socket 202 but prior to the vertical movement of module carrier 228.

Figure 16A:
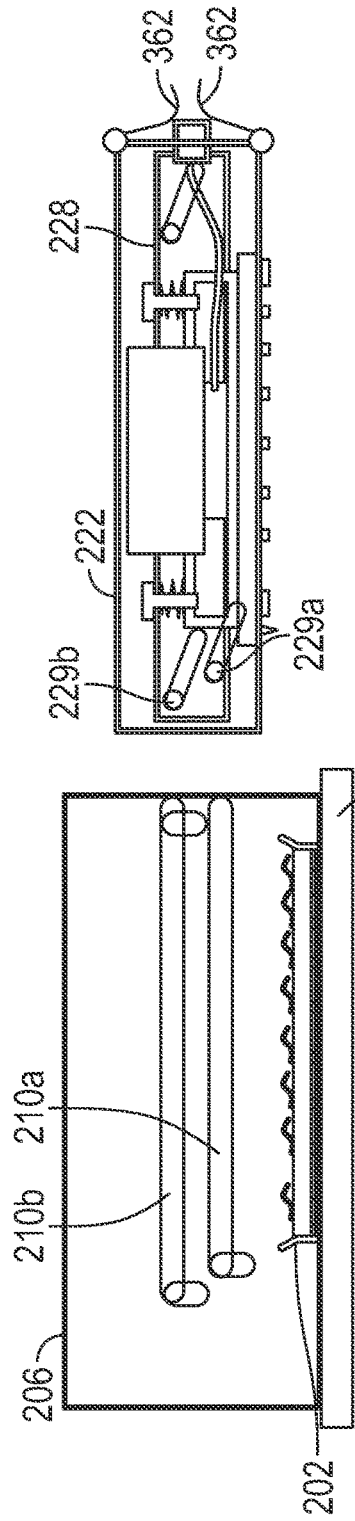
FIGS. 16A-16F illustrate one example of a transceiver module being installed in a system.
Figure 16B:
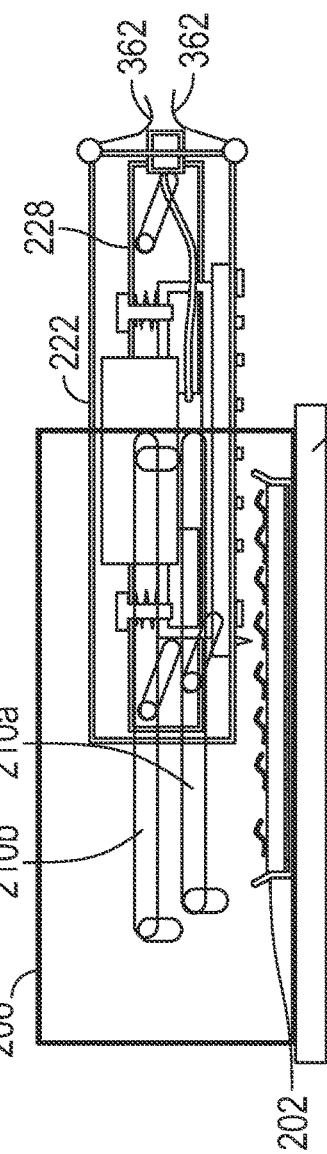
Figure 16C:
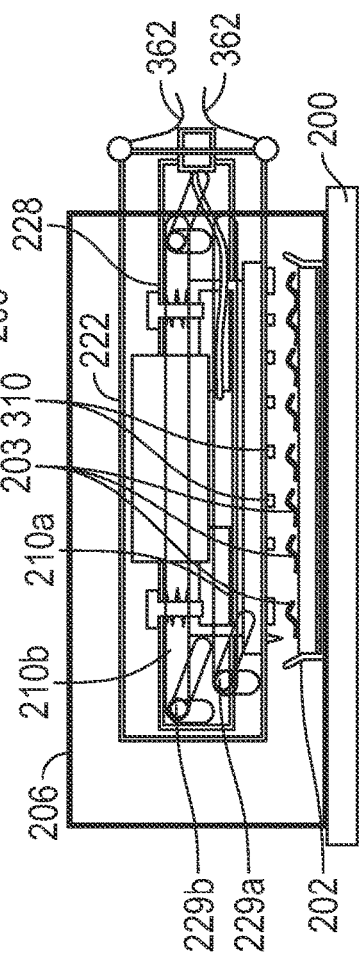

FIGS. 16A-16F illustrate one example of a transceiver module being installed in a system. FIG. 16A illustrates the transceiver module prior to insertion into cage 206. Prior to insertion, a user aligns guide pins 229a-229b of module carrier 228 with horizontal rails 210a-210b of cage 206, respectively. FIG. 16B illustrates the transceiver module partially inserted into cage 206. Module hood 222 and module carrier 228 are moved laterally into cage 206 along horizontal rails 210a-210b. FIG. 16C illustrates the transceiver module when guide pins 229a and 229b of module carrier 228 have reached the end of horizontal rails 210a and 210b, respectively. At this point, contacts 310 of the transceiver module are aligned with contacts 203 of socket 202.

Figure 16D:
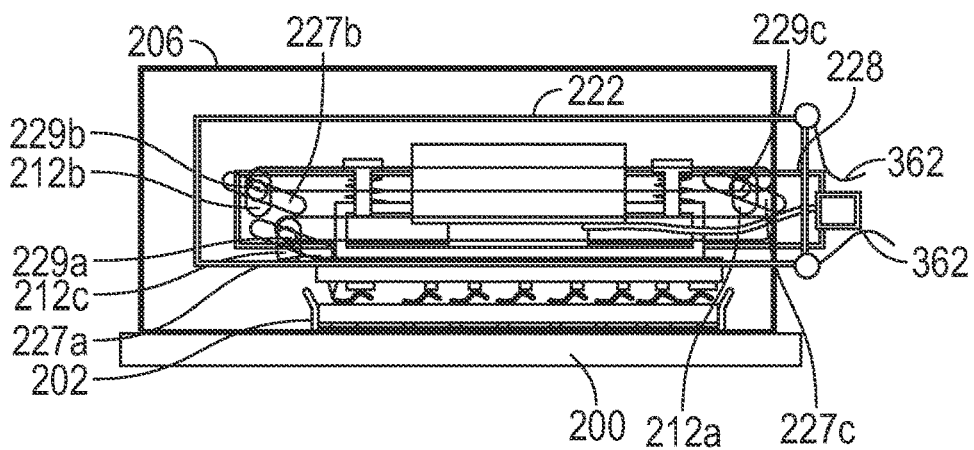
Figure 16E:
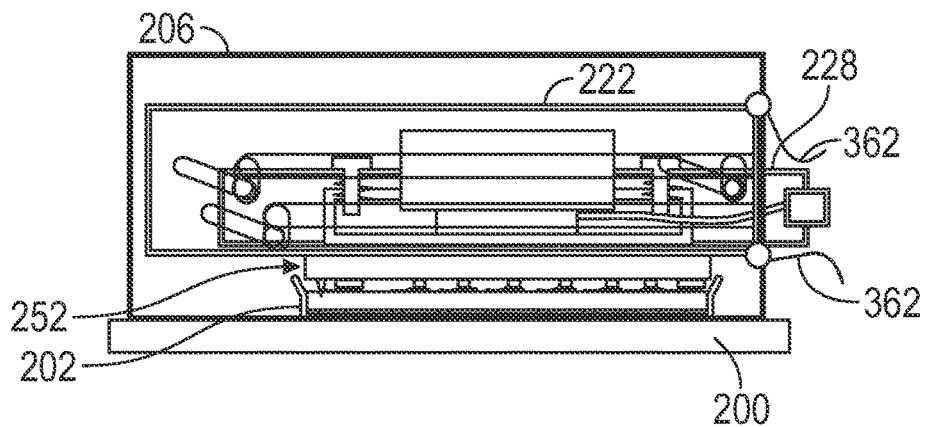
Figure 16F:
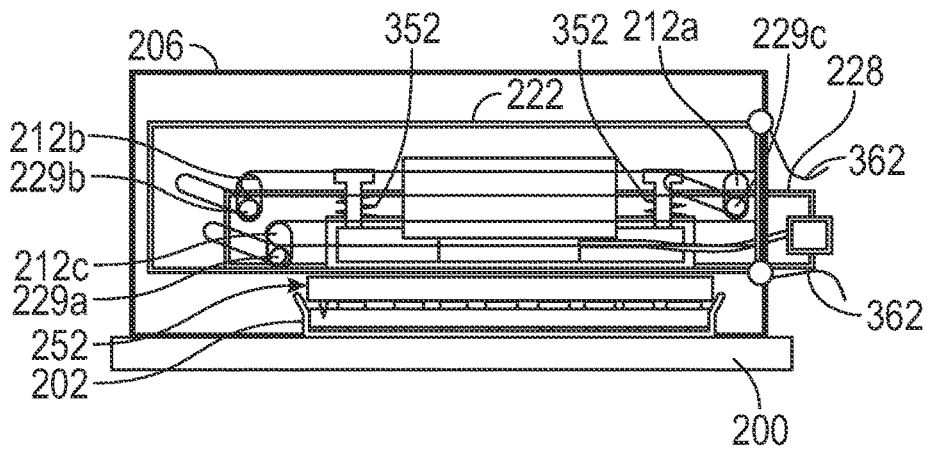

FIG. 16D illustrates additional lateral movement of module hood 222 into cage 206 that conveys downward vertical movement of module carrier 228. The further lateral movement of module hood 222 forces module carrier 228 down vertical rails 212a-212c by forcing guide pins 229a-229c down angled slots 227a-227c, respectively. The angle of angled slots 227a-227c determines how fast module carrier 228 drops down to blindmate substrate assembly 252 to socket 202. FIG. 16E illustrates further lateral movement of module hood 222 into cage 206 that causes substrate assembly 252 to blindmate to socket 202. Finally, as illustrated in FIG. 16F, module hood 222 is fully installed in cage 206 such that module carrier 228 over-drives substrate assembly 252 to apply positive pressure onto the contacts of socket 202. As module carrier 228 over-drives substrate assembly 252, frame springs 352 are compressed as guide pins 229a-229c bottom out in vertical rails 212a-212c. Latch mechanism 144 and latch receiving mechanism 116 (not shown in FIGS. 16A-16F but described with reference to FIGS. 1-2) ensure module hood 222 is securely seated in socket 202 within cage 206, and maintain module carrier 228 to over-drive substrate assembly 252 onto the contacts of socket 202. The transceiver module may be removed by deactivating latch mechanism 144 and reversing the actions of FIGS. 16A-16F.

In FIGS. 16A-16F, a pair of transceiver module doors 362 may be used to protect the optical connector. Cage 206 may also have a cage door (not shown). The cage door may be closed before a transceiver module is installed in cage 206 and pushed open when a transceiver module is installed in cage 206.

Figure 17A:
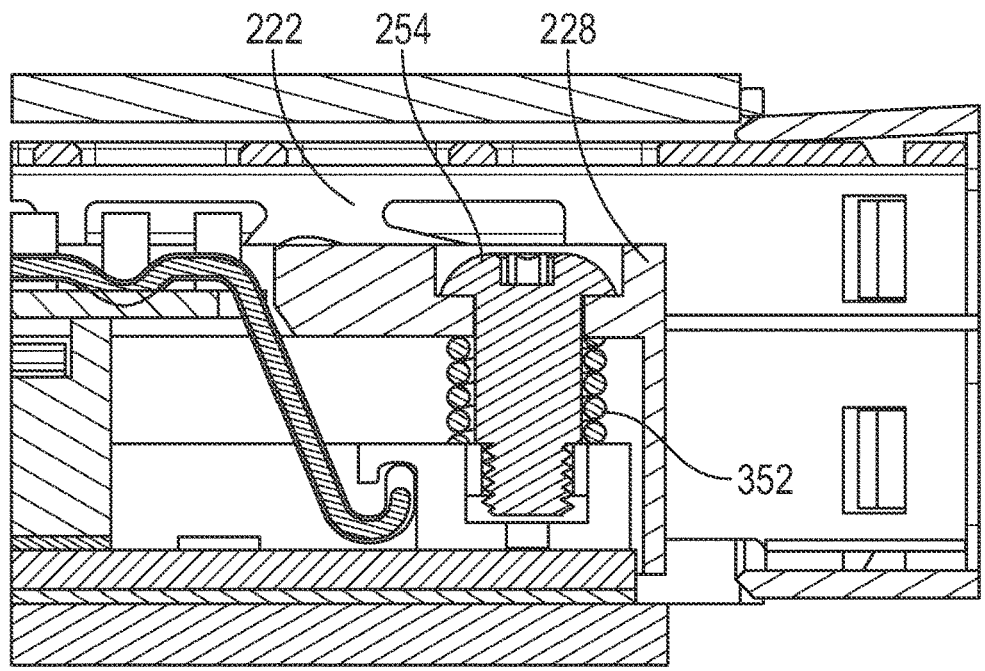
FIG. 17A illustrates an enlarged view of one example of a transceiver module just prior to final mating of the transceiver module to a socket.
Figure 17B:
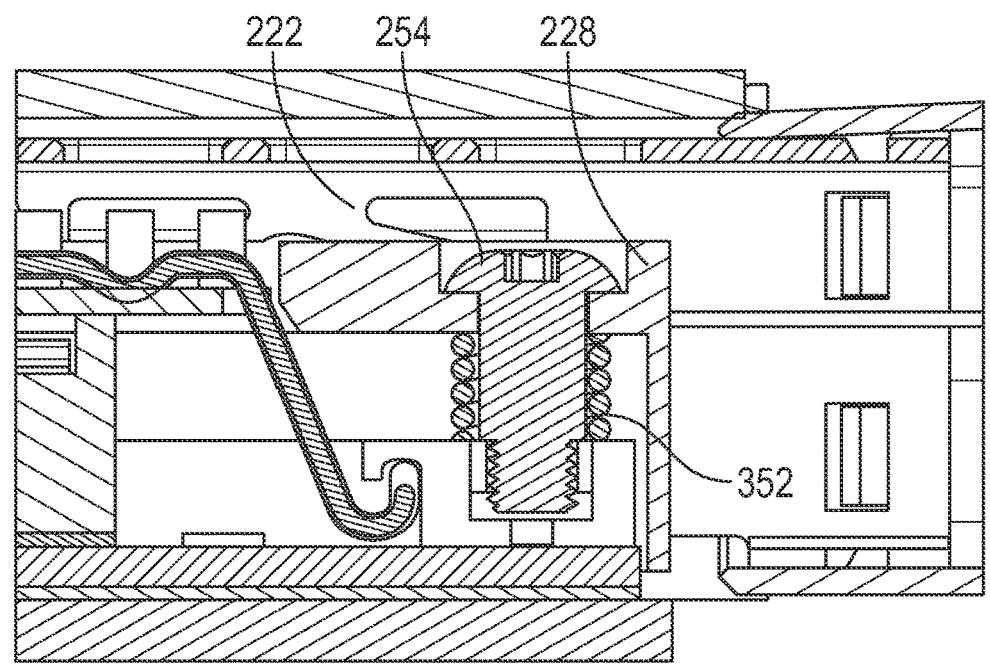
FIG. 17B illustrates an enlarged view of one example of a transceiver module after final mating of the transceiver module to a socket.

FIG. 17A illustrates an enlarged view of one example of a transceiver module just prior to final mating of the transceiver module to a socket. FIG. 17B illustrates an enlarged view of one example of a transceiver module after final mating of the transceiver module to a socket. Just prior to final mating, as illustrated in FIG. 17A, frame bolt 254 is recessed with respect to the top of module carrier 228. As module hood 222 is pushed in slightly more, as illustrated in FIG. 17B, module carrier 228 is pushed downwards slightly such that the top of module carrier 228 is aligned with the top of frame bolt 254 and spring 352 is compressed.

Figure 18A:
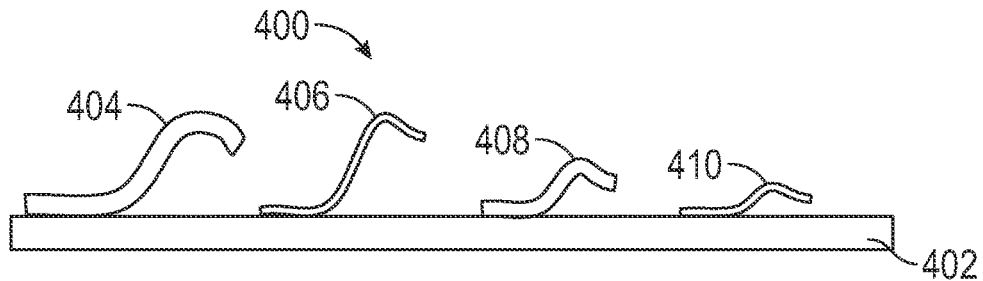
FIG. 18A illustrates a side view and FIG. 18B illustrates a top view of one example of spring contacts of a substrate.
Figure 18B:
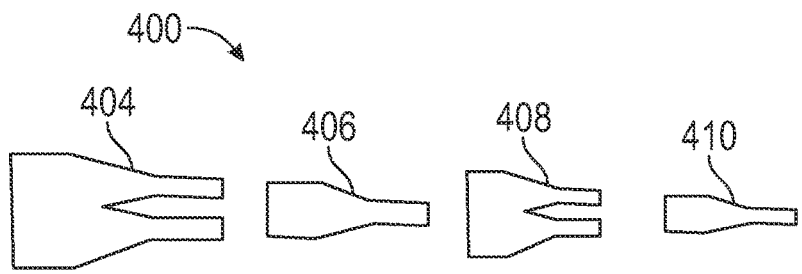

FIG. 18A illustrates a side view and FIG. 18B illustrates a top view of one example of spring contacts 400 of a substrate 402. Spring contacts 400 may be used for contacts of a socket, such as contacts 203 of socket 202 (FIG. 13B) or contacts of a substrate assembly, such as contacts 310 of a substrate assembly 252 (FIG. 14C). Contacts 400 have different heights for hot blindmating. For example, contact 404 may be a ground contact, contact 406 may be an ID contact, contact 408 may be a power contact, and contact 410 may be a signal or present contact.

Contact 404 has the same height as contact 406. Contact 406 has a greater height than contact 408, and contact 408 has a greater height than contact 410. The contacts 400 may have different shapes (and/or thickness) as illustrated in FIG. 18B in addition to different heights as illustrated in FIG. 18A to maintain consistent compression force while providing adequate performance (e.g., adequate electrical current capacity for power contacts or characteristic impedance for high-speed signal contacts). The contact pads that blindmate to contacts 400 have a size large enough for contacts 400 to slide as the contacts are compressed during blindmating.

Figure 19A:
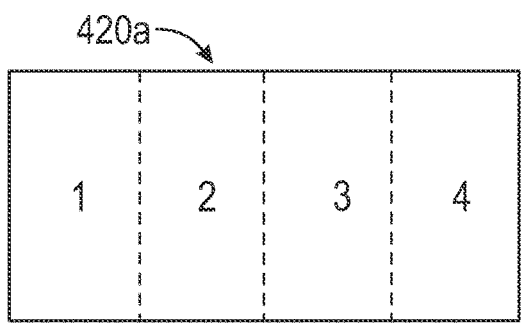
FIGS. 19A-19C illustrate example lane regions for cage contacts.
Figure 19B:
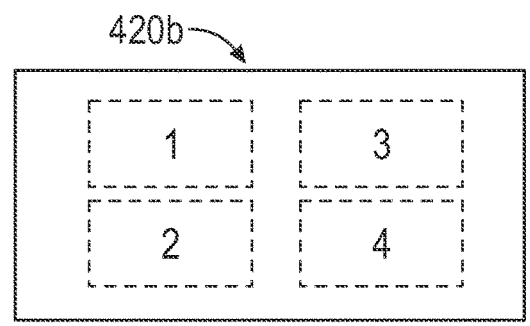
Figure 19C:
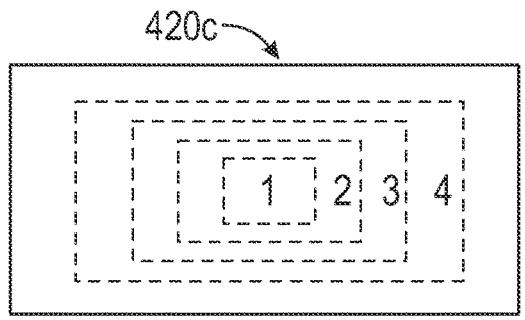

FIGS. 19A-19C illustrate example lane regions for cage contacts. FIG. 19A illustrates one example substrate 420a where four lane regions are arranged in order across the substrate. FIG. 19B illustrates another example substrate 420b where four lane regions are arranged in a grid pattern on the substrate. FIG. 19C illustrates another example substrate 420c where four lane regions are nested within each other. In one example, a lane region may contain 8 lanes and therefore FIG. 19A-19C illustrates 32 lanes. While in this example, 8-lanes/region and four lane region layouts are illustrated, in other examples, another suitable number of lanes and other lane region layouts may be used.

Figure 20A:
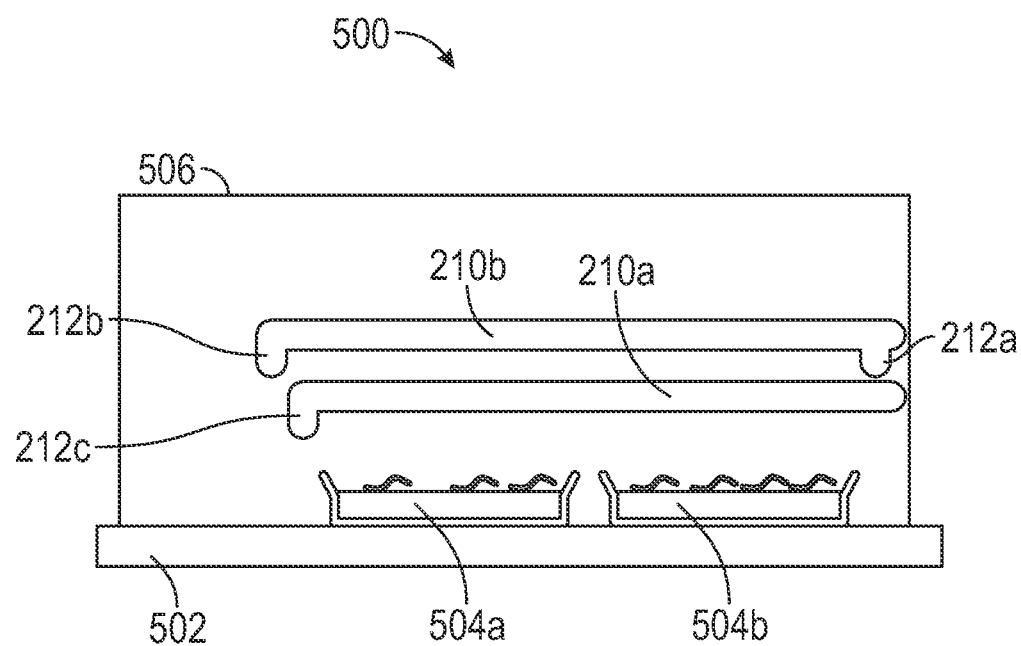
FIG. 20A illustrates one example of a system for receiving a transceiver module having two transceivers.

FIG. 20A illustrates one example of a system 500 for receiving a transceiver module having two transceivers. System 500 includes a system board 502, sockets 504a and 504b, and a cage 506. Sockets 504a and 504b are electrically coupled to system board 502. Cage 506 is attached to system board 502 over sockets 504a and 504b and includes horizontal guide rails 210a-210b and vertical guide rails 212a-212c.

Figure 20B:
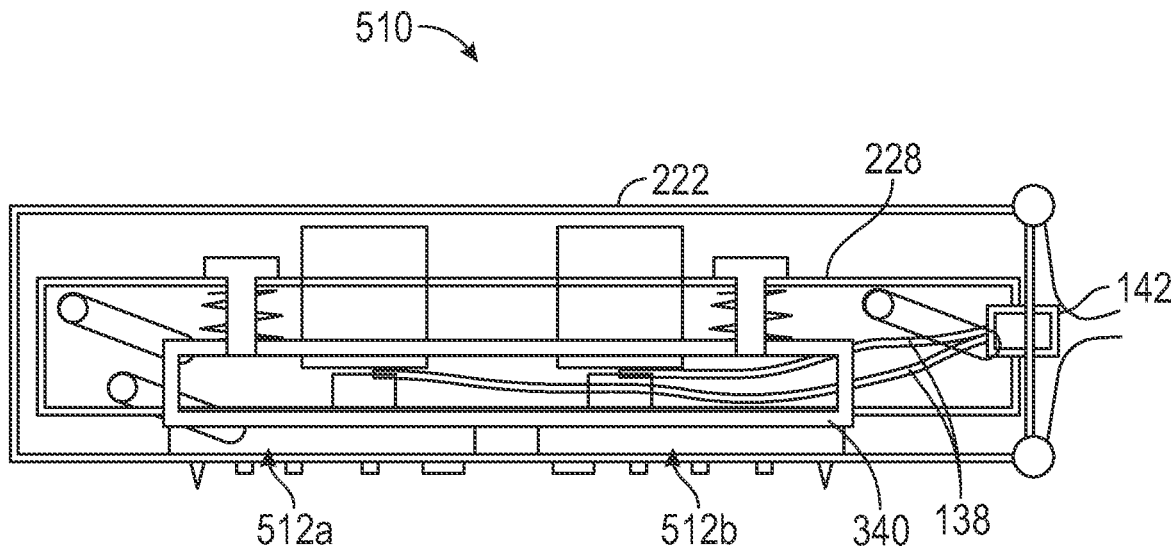
FIG. 20B illustrates one example of a transceiver module having two transceivers.

FIG. 20B illustrates one example of a transceiver module 510 having two transceivers. Transceiver module 510 includes substrate assemblies 512a and 512b attached to a common substrate frame 340. Substrate assemblies 512a and 512b are attached to module carrier 228, which is supported by module hood 222. In this example, optical fibers 138 for each transceiver are terminated on an optical connector 142. In other examples, multiple optical connectors may be used for a transceiver or for multiple transceivers. Transceiver module 510 is installed into cage 506 (FIG. 20A) in the same manner as previously described and illustrated with reference to FIGS. 16A-16F.

Figure 21A:
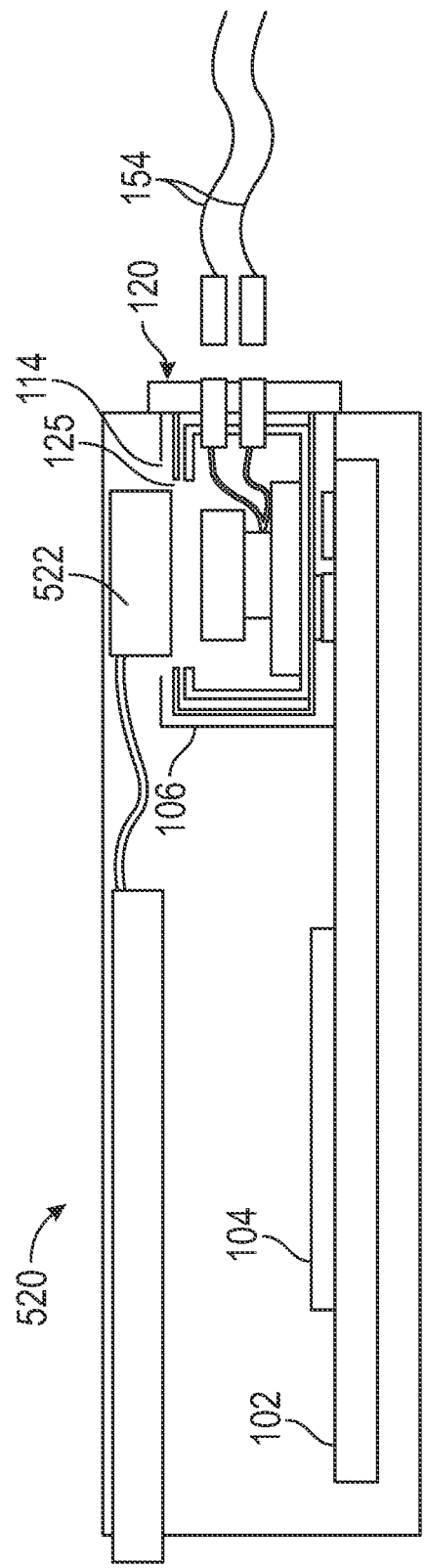
FIGS. 21A-21B illustrate one example of a system including a liquid cooling unit for cooling an installed transceiver module.
Figure 21B:
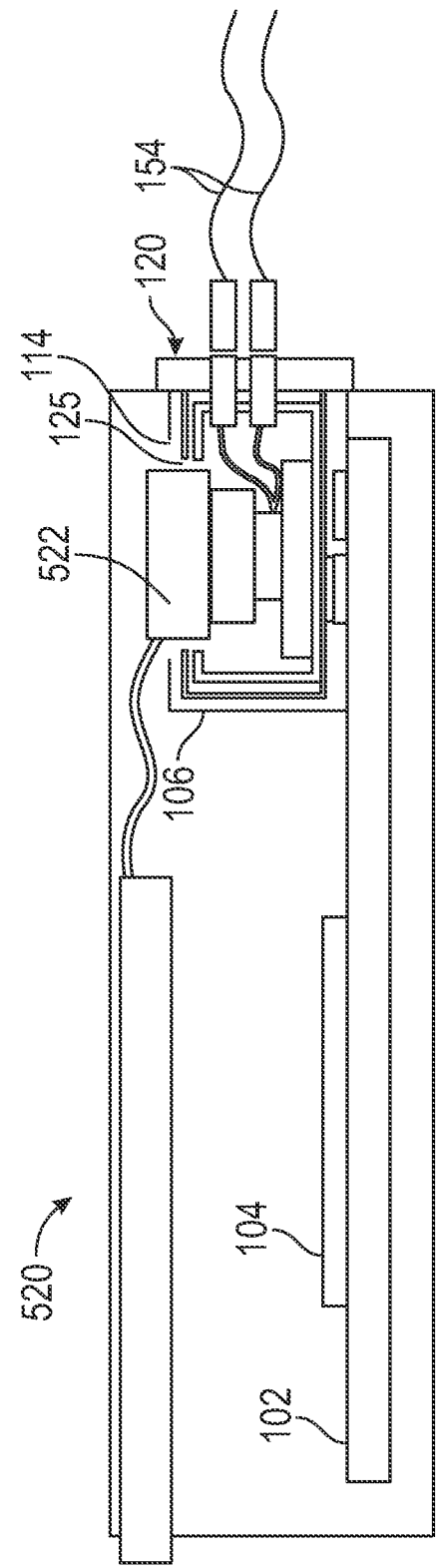

FIGS. 21A-21B illustrate one example of a system 520 including a liquid cooling unit 522 for cooling an installed transceiver module 120. Transceiver module 120 has been previously described and illustrated with reference to FIG. 2. System 520 is similar to system 100 previously described and illustrated with reference to FIG. 1, except for the addition of liquid cooling unit 522. During installation of a transceiver module 120, liquid cooling unit 522 is in a raised position with respect to transceiver module 120 as illustrated in FIG. 21A. Once transceiver module 120 is installed, liquid cooling unit 522 is moved into a lowered position such that the liquid cooling unit contacts the transceiver module as illustrated in FIG. 21B. The force applied to transceiver module 120 by liquid cooling unit 522 may maintain positive pressure between the contacts of the transceiver module and the contacts of the socket on the system board.

Examples of VLP transceiver modules described herein have a footprint that can support a larger number of lanes on one PCB or substrate compared to conventional pluggable transceiver modules that use right-angle connectors and two PCBs (e.g., CXP and CDFP), thereby enabling more efficient use of the space available on a system board. The contacts of the VLP transceiver modules provide better signal integrity and are more easily scaled than right-angle connectors of conventional pluggable transceiver modules. The VLP transceiver modules may be hot-pluggable, simplifying servicing and upgrading of network systems without powering down the systems. Multiple or different lane-count optical cables may be used with the VLP transceiver modules, eliminating the use of break-out cables.

VLP transceiver modules may be installed, up to the maximum lane-count supported by a VLP cage, enabling the combined use of optical cables within a VLP transceiver module by multiple optical transceivers. This is useful for high-bandwidth trunk cable applications, and enables high optical connector faceplate density. The top of the VLP transceiver modules may be wide open for efficient air cooling. The top of the VLP transceiver modules may be designed for liquid cooling where positive pressure for heat extraction also serves as a positive mating force for the substrate contacts within the corresponding socket(s). Further, since a VLP transceiver module can support a higher number of lanes than conventional pluggable transceiver modules and may use less space, electro-mechanical overhead is lower, which may enable lower overall system costs.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A system comprising:
a system board comprising first contacts;
a cage attached to the system board over the first contacts, including guide rails;
the cage to accept a removable transceiver module, wherein the removable transceiver module comprises a module hood, module carrier and second contacts; wherein the module carrier includes guide pins that extend through angled slots formed in the module hood so that the guide pins are received by the guide rails of the cage in a lateral movement with respect to the cage to align the second contacts with the first contacts and, as the transceiver module is fully inserted into the cage, the guide pins move at an angle to force a vertical movement of the transceiver module with respect to the cage to electrically connect the first contacts to the second contacts.

2. The system of claim 1, wherein the module carrier is disposed within the module hood such that the transceiver module is installable in the cage in response to one continuous lateral movement of the module hood into the cage such that the module hood first moves the module carrier in the lateral movement and in the vertical movement to align and electrically connect the second contacts to the first contacts.

3. The system of claim 1, wherein the transceiver module comprises alignment features to engage with alignment features of the system board with the transceiver module installed in the cage.

4. The system of claim 1, wherein the cage comprises an electromagnetic interference gasket to prevent air flow and electromagnetic leakage between a cable bulkhead of the transceiver module and the cage with the transceiver module installed in the cage.

5. The system of claim 1, wherein the transceiver module comprises a first opening to expose a heat sink of a transceiver chip within the transceiver module, and
wherein the cage comprises a second opening to expose the heat sink to air flow with the transceiver module installed in the cage.

6. The system of claim 1, wherein the cage comprises a latch receiving mechanism, and
wherein the transceiver module comprises a latch mechanism that engages with the latch receiving mechanism with the transceiver module installed in the cage.

7. A device comprising:
a system board comprising contacts to electrically couple to a removable transceiver module;
wherein the removable transceiver module includes a module hood comprising angled slots, a module carrier comprising guide pins that extend through the angled slots of the module hood; and
a cage coupled to the system board over the contacts, the cage comprising first guide rails to laterally receive the guide pins of the module carrier and second guide rails perpendicular to and connected to the first guide rails to vertically position, via vertical movement of the module hood about the guide pins, the transceiver module to electrically couple the transceiver module to the contacts in response to the transceiver module being installed in the cage.

8. The device of claim 7, further comprising:
a socket attached to the system board within the cage, the socket having contacts electrically coupled to the contacts of the system board.

9. The device of claim 7, wherein the contacts comprise spring contacts having different heights.

10. The device of claim 9, wherein the contacts comprise ground contacts having a first height, power contacts having a second height less than the first height, and signal contacts having a third height less than the second height.

11. A device comprising:
a module hood comprising slots;
a module carrier within the module hood, the module carrier supporting a transceiver chip within the module carrier, the module carrier comprising guide pins on sides of the module carrier that couple to guide rails of a cage, and wherein the guide pins extend through the slots of the module hood such that lateral movement of the module hood with respect to the module carrier conveys a vertical movement to the module carrier with respect to the module hood.

12. The device of claim 11, further comprising:
a substrate assembly attached to the module carrier, the substrate assembly comprising a substrate frame attached to a substrate, the substrate electrically coupled to the transceiver chip, and the substrate comprising contacts to electrically couple the transceiver chip to contacts of a system board.

13. The device of claim 12, wherein the module carrier is attached to the substrate frame by a plurality of bolts, each bolt surrounded by a spring to apply a force between the substrate frame and the module carrier such that compression of each spring overdrives the substrate assembly to electrically couple the contacts of the substrate to contacts of system board.

14. The device of claim 12, further comprising:
a sliding lid to cover the contacts of the substrate when closed and to expose the contacts of the substrate when opened.

15. The device of claim 11, further comprising:
a cable bulkhead attached to the module hood, the cable bulkhead comprising an optical connector optically coupled to the transceiver chip.

* * * * *